United States Patent
Ohshima

(10) Patent No.: US 6,269,011 B1
(45) Date of Patent: Jul. 31, 2001

(54) POWER SUPPLY SYSTEM HAVING SEMICONDUCTOR ACTIVE FUSE

(75) Inventor: Shunzou Ohshima, Shizuoka-ken (JP)

(73) Assignee: Yazaki Corporation, Tokyo (JP)

( * ) Notice: Subject to any disclaimer, the term of this patent is extended or adjusted under 35 U.S.C. 154(b) by 0 days.

(21) Appl. No.: 09/502,007

(22) Filed: Feb. 11, 2000

(30) Foreign Application Priority Data

Feb. 14, 1999 (JP) .................................................. 11-074266

(51) Int. Cl.$^7$ ................................ H02H 7/10; H02H 3/00
(52) U.S. Cl. ................................ 363/50; 363/89; 323/908; 361/93
(58) Field of Search ................................ 363/50, 56, 58, 363/57, 136, 89; 323/315, 908, 282; 361/93.9, 56, 115, 18

(56) References Cited

U.S. PATENT DOCUMENTS

| | | | |
|---|---|---|---|
| 4,562,454 | * 12/1985 | Schultz | 257/529 |
| 5,175,676 | * 12/1992 | Kikuchi | 363/58 |
| 5,621,601 | * 4/1997 | Fujihira et al. | 361/115 |
| 5,804,859 | * 9/1998 | Takahashi et al. | 257/355 |

FOREIGN PATENT DOCUMENTS

| | | |
|---|---|---|
| 0 529 650 A2 | 8/1992 | (EP) . |
| 1-227520 | 9/1989 | (JP) . |
| 2-266836 | 10/1990 | (JP) . |
| 3-262209 | 11/1991 | (JP) . |
| 4-134271 | 5/1992 | (JP) . |
| 5-52880 | 3/1993 | (JP) . |
| 6-27157 | 2/1994 | (JP) . |
| 6-61432 | 3/1994 | (JP) . |
| 6-188704 | 7/1994 | (JP) . |
| 6-244693 | 9/1994 | (JP) . |
| 9-145749 | 6/1997 | (JP) . |

* cited by examiner

Primary Examiner—Rajnikant D. Patel
(74) Attorney, Agent, or Firm—Finnegan, Henderson, Farabow, Garrett & Dunner, L.L.P.

(57) ABSTRACT

The power supply system of the present invention includes m first semiconductor active fuses arranged in parallel with each other in a forward direction, a first wire having m branches, each branch is connected to one of m input terminals of the m first semiconductor active fuses, m intermediate wires, each of intermediate wires is connected to one of the first end of the m input terminals of the m first semiconductor active fuses, m second semiconductor active fuses arranged in parallel with each other in a reverse direction, each of the second embodiment active fuses having an output terminal connected to one of the second end of the m intermediate wires, and a second wire having m branches, each branch is connected to one of m input terminals of the m second semiconductor active fuses. Each of the reverse configured m second semiconductor active fuses can conduct the main current forwardly through parasitic diode inherently embodied in the structure. Employing this structure, the present invention provides a power supply system with high reliability.

14 Claims, 15 Drawing Sheets

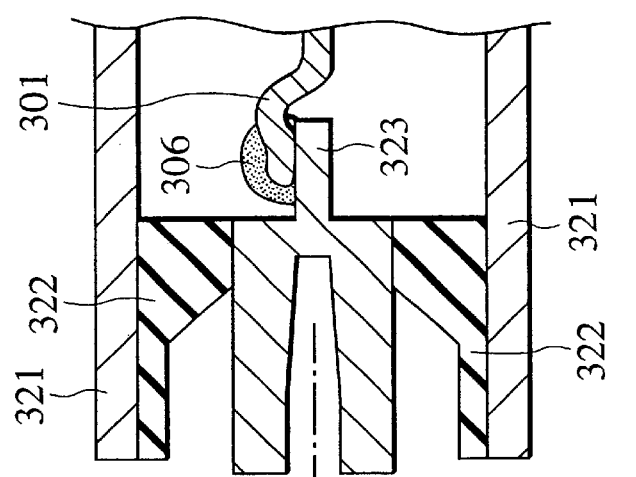
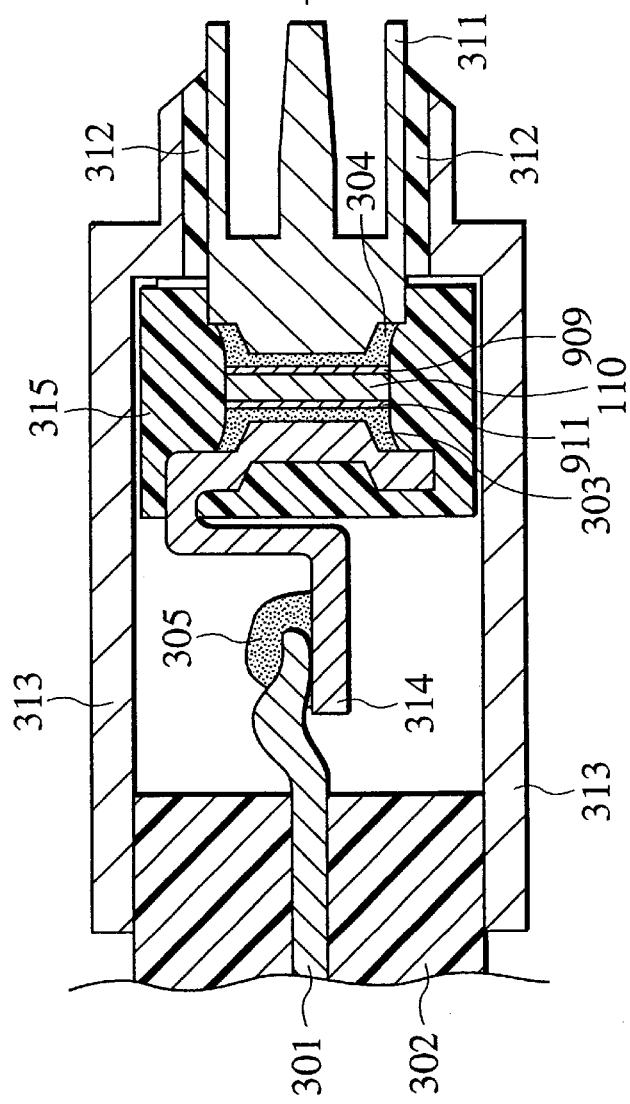

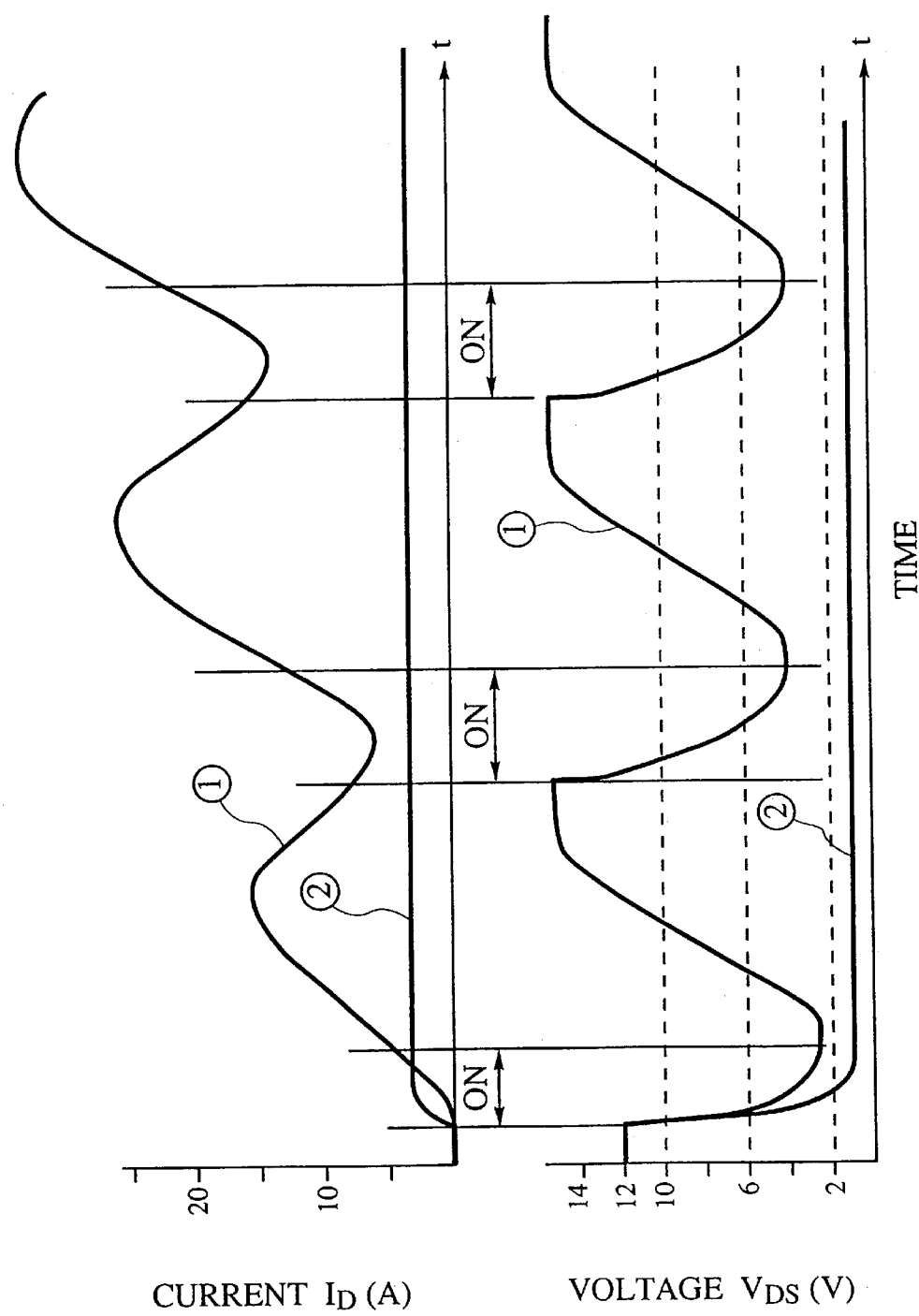

POWER SUPPLY SYSTEM HAVING SEMICONDUCTOR ACTIVE FUSE

BACKGROUND OF THE INVENTION

1. Field of the Invention

The present invention relates to a power supply cable preferable for use in a vehicle to supply electric power from the battery of the vehicle to each section thereof. More specifically, the present invention relates to a power supply cable having "a semiconductor active fuse" which can detect an abnormal current and/or short-circuit failure and if necessary, can cut off the conduction of the current. The present invention also relates to a power supply system having a plurality of the power supply cables.

2. Description of the Related Art

FIG. 1 is a diagram showing a conventional power supply system provided with an overcurrent controller installed in a vehicle, where electric power is selectively supplied from the battery to each load of the vehicle, and a transistor QF, having a temperature sensor, controls the supply of the electric power. In the conventional overcurrent controller shown in FIG. 1, the power supply cable extending from a power source 101 for supplying an output voltage VB is connected to an end of a shunt resistor RS and a drain terminal D of the transistor QF, having the temperature sensor, is connected to the second end of the shunt resistor RS. To a source terminal S of the transistor QF, a load 102 is connected. The load 102 is, for example, a headlight or a driving motor for power windows of the vehicle. The overcurrent controller used for the power supply cable shown in FIG. 1 further includes a driver 701 for detecting a current which flows through the shunt resistor RS and controlling the operation of the transistor QF, and A/D converter 702 for converting the analogue value of the current monitored by the driver 701 into the digital values, and a microcomputer (CPU) 703. The transistor QF has a thermal protection function such that it can turn off when its junction temperature increases to a predetermined temperature or higher. In this case, a temperature sensor incorporated therein detects the increase of the temperature of the semiconductor chip, and then a flip-flop circuit (or a latch circuit) is triggered by the temperature sensor to turn on the thermal cutoff transistor which cause the transistor QF compulsorily to be turned off.

In FIG. 1, a Zener diode ZD1 keeps the voltage between the gate terminal G and the source terminal S of the transistor QF at 12 V. When an overvoltage is applied to a true gate TG of the transistor QF, the Zener diode ZD1 bypasses the overvoltage. The driver 701 includes differential amplifiers 711, 713 as current monitors, a differential amplifier 712 as a current limiter, a charge pump 715, and a driver 714. The driver 714 drives the true gate TG of the transistor QF through an internal resistor RG based on an ON/OFF control signal from the microcomputer 703 and the result of the judgment from the differential amplifier 712 as the current limiter whether or not an overcurrent is generated. When the differential amplifier 712 detects the over current more than the predetermined, by means of the voltage drop across the shunt resistor RF, the driver 714 turns off the transistor QF. After that, when the current value decreases less than a lower criterion, the driver 714 turns on the transistor QF, again. The microcomputer 703 always monitors the current via the current monitors (i.e. the differential amplifiers 711, 713). When the flow of an abnormal current exceeding the normal value is monitored, the microcomputer 703 outputs a signal for turning off the transistor QF. Upon receiving the signal, the transistor QF is turned off. However, if the temperature sensor installed in the transistor QF detects that the temperature exceeds the predetermined value before the microcomputer 703 outputs the signal for turning off the transistor QF, the temperature sensor outputs a signal for making the thermal protection function of the transistor QF to work. Upon receiving the signal, the transistor QF is turned off.

As described above, the overcurrent controller employed for the conventional power supply cable requires the shunt resistor RS connected to a power supply path in series in order to detect the current. Thus structure, however, has a problem as follows. Since larger and larger current flows in the load in recent years, it becomes impossible to ignore the heat dissipation of the shunt resistor, and the conduction loss of the power supply cable becomes large. This problem is especially serious when larger current is passed through the power supply cable, and in such a case, it is required to install a cooler to the overcurrent controller.

In addition, there is another problem. That is, in the case of using the conventional power supply cable having the thermal protection function, the over current control circuit successfully works when the load 12 or the power supply cable would be short-circuited completely so that a large current flows therethrough. However, such functions do not work when a layer short-circuit, or an imperfect short-circuit having some degree of short-circuit resistance occurs so that a low short-circuit current flows through the power supply cable. As the only method to cover this drawback, the monitor must diagnose the current flowing through the power supply cable so that the microcomputer 703 recognizes an abnormal current. When the microcomputer 703 detects an abnormal current, it turns off the transistor QF. However, this method has a problem that, the current detection of the microcomputer 703 is not so fast that shutting down of the transistor QF may be delayed.

There is also a problem that, in accordance with the necessity to mount the shunt resistor RS, the A/D converter 702, and the microcomputer 703 or the like, a large space is required for the power supply device. In addition, since these elements are relatively expensive, the cost of the apparatus provided with them becomes high.

SUMMARY OF THE INVENTION

The present invention has been contrived to solve the problems of the above-described prior arts, and an object thereof is to provide a power supply system, having a small conduction loss by eliminating the shunt resistor employed by conventional power supply system, the shunt resistor was directly connected to the power supply path in order to detect an abnormal current flowing through the power supply cable.

Another object of the present invention is to provide a power supply system with high reliability and safety, implementing quick response even when an imperfect short-circuit having some degree of short-circuit resistance occurs in a power supply cable.

Still another object of the present invention is to provide a power supply system including a plurality of the power supply cables comprising intermediate wires. When a short-circuit failure occurs at one or some of the power supply cables, the short-circuited cable is immediately cutoff, thereby avoiding the influence of the short-circuit failure to the remaining cables and/or loads.

Still another object of the present invention is to provide a power supply system where, even if a trouble such as a breaking failure, or an open circuit failure in a cable occurs, the remaining cables work, thereby easily increasing reliability and safety.

Still another object of the present invention is to provide a power supply system where two power sources are easily available at a low cost.

In regard of above objects, a feature of the present invention inheres in a power supply system including a first wire having m branches (m≧2), m first semiconductor active fuses connected to the respective branches of the first wire, m intermediate wires, each of the intermediate wires having first and second ends, the first end is connected to one of the first semiconductor fuses, m second semiconductor active fuses respectively connected to the second end of the intermediate wires, and a second wire having m branches respectively connected to the second semiconductor active fuses. Each of the first semiconductor active fuses includes at least a first main semiconductor element, a first reference semiconductor element, a first comparator, and a first driver. Each of the first main semiconductor element includes a first main electrode connected to one of the branches of the first wire, a second main electrode opposing to the first main electrode, a first control electrode for controlling a main current flowing through the first and second main electrodes, and a first parasitic diode of which cathode region is connected to the first main electrode thereof and of which anode region is connected to the second main electrode thereof. The first reference semiconductor element includes a third main electrode and second control electrode respectively connected to the first main electrode and a first control electrode, and a fourth main electrode. The first comparator has input terminals connected to the second and fourth main electrodes respectively. And the first comparator compares a voltage of the second main electrode with a voltage of the fourth main electrode. Each of the second semiconductor active fuses includes at least a second main semiconductor element, a second reference semiconductor element, a second comparator, and a second driver. Each of the second main semiconductor elements includes a fifth main electrode connected to one of the second end of the m intermediate wires, a sixth main electrode opposing to the fifth main electrode, a third control electrode for controlling a main current flowing through the fifth and sixth main electrodes, and a second parasitic diode of which anode region is connected to the fifth main electrode and of which cathode region is connected to the sixth main electrode. The second reference semiconductor element includes seventh, eighth main electrodes and a fourth control electrode. The eighth main electrode and the fourth control electrode respectively connected to the sixth main electrode and the third control electrode. The second comparator has input terminals connected to the fifth and seventh main electrodes respectively. The second comparator compares a voltage of the fifth main electrode with a voltage of the seventh main electrode. The m branches of the second wire are respectively connected to the m sixth main electrodes of the m second semiconductor active fuses, respectively.

In the first semiconductor active fuses used for the power supply cable according to the feature of the present invention, the first comparator compares the voltage of the first main semiconductor element with the voltage of the first reference semiconductor element, that is, the voltage of the second main electrode with the voltage of the fourth main electrode. When an abnormal current is generated, the first main semiconductor element starts to repeat turning on and off so as to generate a current oscillation using the output of the first comparator. By counting the number of the current oscillation or detecting an increase in the temperature of the semiconductor chip caused by the current oscillation, the first main semiconductor element is cutoff. Similarly, in the second semiconductor active fuse, the second comparator compares the voltage of the second main semiconductor element with the voltage of the second reference semiconductor element, that is, compares the voltage of the fifth main electrode with the voltage of the seventh electrode. When an abnormal current is generated, the second main semiconductor element is turned on and off to generate current oscillation. By use of the current oscillation, the second main semiconductor element is cutoff.

Each of the first and second main semiconductor elements can be merged on a semiconductor chip, respectively, so as to form integrated structures serving as the "semiconductor active fuses" of the present invention. For example, the first and second main semiconductors may be metal oxide-semiconductor (MOS) transistors, respectively. As the power MOS transistors, the double diffused MOS field-effect-transistors (DMOS FET) can be employed, for example. Besides the DMOS FETs, another power MOS transistors having VMOS or UMOS structures, or MOS static-induction-transistors (MOS SITs) having structures similar to MOS FETs can be used. MOS composite devices such as emitter-switched-thyristors (ESTs) can be employed. Furthermore, there is no reason to exclude another insulated gate power devices such as insulated-gate-bipolar-transistors (JGBTs). If the gate electrode is always reverse biased, junction FETs, junction SITs, and SI thyristors also may be used. The main semiconductor elements preferably are reverse conducting semiconductor devices. That is, if they are reverse conducting semiconductor power devices, the parasitic p-n junction diodes structurally present in the devices can be used as paths for the current flowing through the second semiconductor active fuse in a forward direction, where the second semiconductor active fuse is connected in a reverse configuration. The first and second reference semiconductor elements are formed with the units of the same types as of the first and second main semiconductor elements, but the number of the units thereof are smaller than the first and second main semiconductor elements.

The first and second main electrodes of the first main semiconductor element are respectively connected to the first and second main electrode regions of the power device constituting the first main semiconductor element. The term "the first main electrode region" means either an emitter region or collector region, if the first main semiconductor element is the IGBT. Or, the term "the first main electrode region" means either a source region or drain region, if the first main semiconductor element is a power MOS transistor, or more generally a power insulated gate transistor (power IGT) such as the power MOS FET and the power MOS SIT. The term "second main electrode region" means either the emitter region or collector region which is not the first main electrode region of the IGBT, and means either the source region or drain region which is not the first main electrode region for the power IGT. Specifically, if the first main electrode region is the emitter region, the second main electrode region is the collector region. If the first main electrode region is the source region, the second main electrode region is the drain region. The term "first control electrode" means a gate electrode of the IGBT and power IGT. As to the first reference semiconductor element QB1 having a current-voltage characteristic similar to that of the first main semiconductor element QA1, the same definitions as of the first main semiconductor element are adopted for the terms "third and fourth main electrodes" and "second control electrode". The reverse definitions to the first main semiconductor element are adopted for the terms "fifth and sixth main electrode", and "a third control electrode" of the second main semiconductor element, and "seventh and eighth main electrode" and "a fourth control electrode" of the second reference semiconductor element, since the second semiconductor active fuses are connected to the m intermediate wires in the reverse configuration.

The first and second semiconductor active fuses used for the power supply cable according to the feature of the present invention needs no shunt resistor for overcurrent detection which was connected to the conventional power cable in series for overcurrent diagnosis. By eliminating the necessity of shunt resistor, the thermal dissipation, or the conduction loss of the entire power supply system can be suppressed to the lower level. It is also possible to quickly and simply detect not only the overcurrent caused by dead short-circuit, but also the abnormal current caused by imperfect short-circuit failure having some degree of short-circuit resistance. In addition, the power supply system according to the feature of the present invention needs no microcomputer for detecting and controlling overcurrent. By eliminating the necessity of the microcomputer, the space for mounting the detector and control circuit for the overcurrent can be saved. At the same time, the cost of the power supply system as a whole can be greatly reduced. Since there is no need of the classical "passive fuse", or the metallic fuse that melts when current exceeds a specific amperage, the downsizing and weight reduction of the power supply cable are promoted, and accordingly, there is no need of exchanging the blown fuse. As a result, the power supply cables employing the semiconductor active fuses increase the reliability of the system.

As stated above, the power supply system according to the feature of the present invention includes a plurality of intermediate wires (in the number of m). Therefore, first and second semiconductor active fuses connected to both ends, or the first and second ends, of the intermediate wire can cut off the short-circuited wire, rapidly, so as to separate the intermediate wire immediately, when the trouble of grounding, etc. arose in the wire, and when the abnormally large current flows. Therefore, it can be avoided that the effects of the troubles reach to another normal intermediate wires. This time, the total current handling capability (the maximum available current value) of the power supply system decreases, because the number of the normal intermediate wire decreases to m−1. However, the electric power can be supplied to the load, as before of trouble occurrence, if load current is within the maximum available current value after the trouble generation. This will bring multiplicity (redundancy) to the power supply system. By this, it is possible to drastically raise the reliability of the power supply system.

In the meantime, let's suppose that the maximum current value to be supplied to the load is $I_{max}$. Further we suppose that the current flows uniformly and equally in the plurality of intermediate wires. For example, the trouble diagnosis current value can be set to be the double of the maximum current value, here. In case of the power supply system which consists of a single wiring, the trouble diagnosis current value becomes $2 \times I_{max}$. However, the trouble diagnosis current value becomes $2 \times I_{max}/m$ in for the power supply system of the present invention, in which the parallel configuration of m intermediate wires is employed. That is to say, abnormal conditions such as the short circuit grounding can be judged at higher accuracy, because trouble diagnosis current value can be set at 1/m.

Still, parasitic p-n junction diode, which is structurally inherent, is utilized as current path for the second semiconductor active fuse, as it was mentioned earlier. The on-resistance is low for this parasitic element, because it is formed in the large area. Therefore, the conduction loss as a whole does not increase, even if two semiconductors active fuse are connected, facing in a reverse topology. In addition, by use of the parasitic element (the parasitic p-n junction diode), the number of elements in the second semiconductor active fuse can be reduced, thereby downsizing the entire device. This structure has an advantage in that it easy to increase reliability and safety of the power supply cables.

Other and further objects and features of the present invention will become obvious upon an understanding of the illustrative embodiments about to be described in connection with the accompanying drawings or will be indicated in the appended claims, and various advantages not referred to herein will occur to one skilled in the art upon employing of the invention in practice.

BRIEF DESCRIPTION OF THE DRAWINGS

FIG. 3C is a schematic sectional view showing a cable connector (plug) in which the power IC of FIG. 3B is mounted.

FIG. 3D is a schematic sectional view showing a jack scheduled to be connected to the plug of FIG. 3C.

FIG. 7A is an explanatory diagram illustrating the transient response characteristics of the drain current flowing through the main semiconductor element of the semiconductor active fuse used for the power supply system of the present invention.

FIG. 7B is an explanatory diagram illustrating the transient response characteristics of the voltage between the drain and source electrodes which correspond to the response shown in FIG. 7A.

DETAILED DESCRIPTION OF THE PREFERRED EMBODIMENTS

Figure 1:
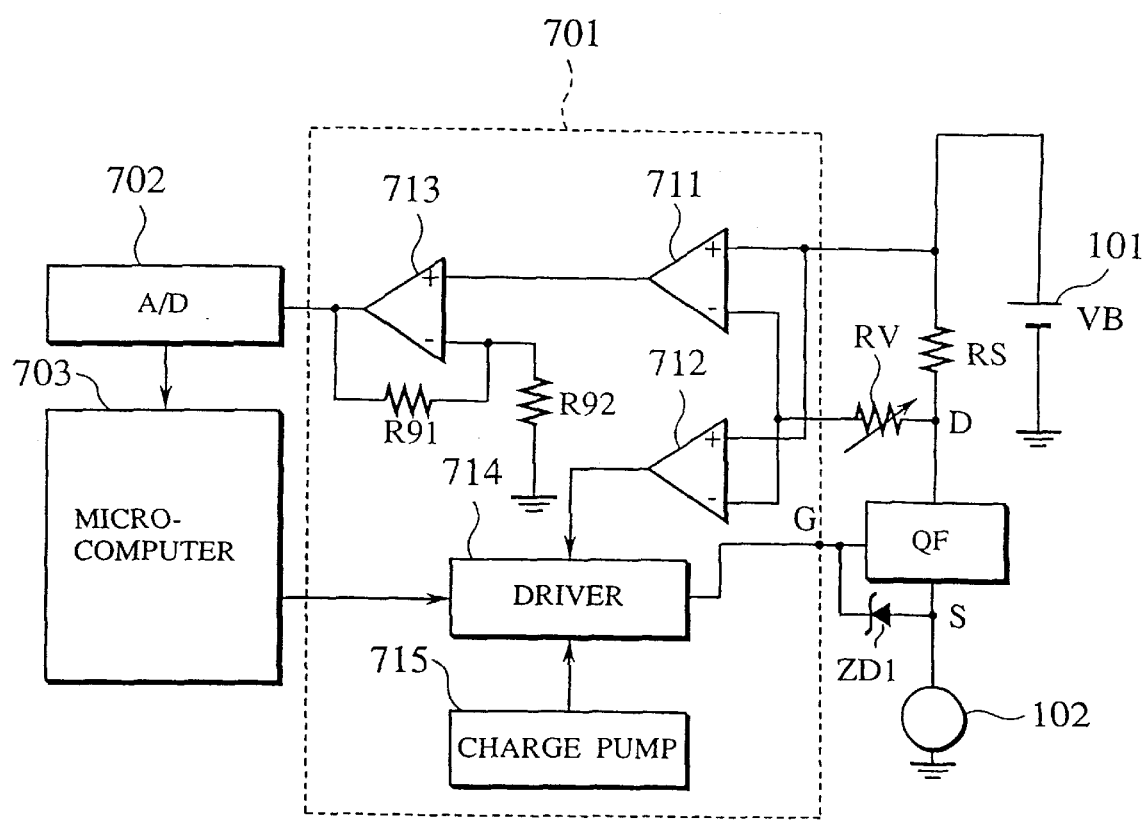
FIG. 1 is a block diagram showing a conventional overcurrent controller.

Various embodiments of the present invention will be described with reference to the accompanying drawings. It is to be noted that the same or similar reference numerals are applied to the same or similar parts and elements throughout the drawings, and the description of the same or similar parts and elements will be omitted or simplified. Generally and as its is conventional in the representation of semiconductor devices, it will be appreciated that the various drawings are not drawn to scale from one figure to another nor inside a given figure, and in particular that the layer thickness are arbitrarily drawn for facilitating the reading of the drawings. In the following descriptions, numerous specific details are set fourth such as specific signal values, etc. to provide a through understanding of the present invention. However, it will be obvious to those skilled in the art that the present invention may be practiced without such specific details. In other instances, well-known circuits have been shown in block diagram form in order not to obscure the present invention in unnecessary detail.

Prior to the description of the embodiments of the present invention, a typical structure and a basic operation of the semiconductor active fuse used for the power supply system of the present invention will be described.

(BASIC STRUCTURE OF POWER SUPPLY SYSTEM AND SEMICONDUCTOR ACTIVE FUSE)

Figure 8A:
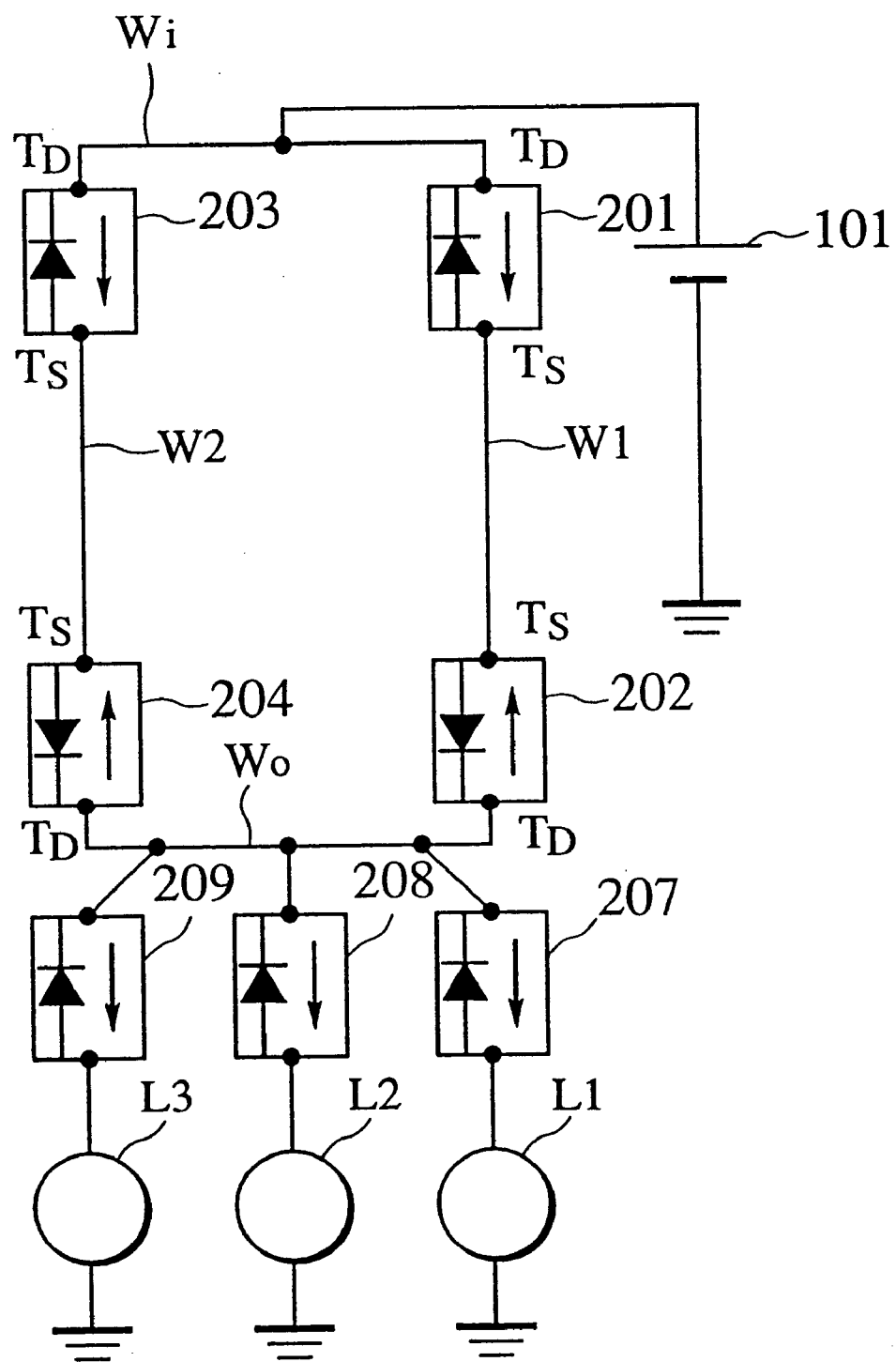
FIG. 8A is a block diagram schematically showing a power supply system according to a first embodiment of the present invention.

As shown in FIG. 8A, the power supply system of the present invention includes, as a basic structure, a first wire $W_1$, m first semiconductor active fuses 201, 203, . . . connected to the first wire $W_1$ (m≧2), m intermediate wires $W_1$, $W_2$, . . . connected to the m first semiconductor active fuses 201, 203, . . . and m second semiconductor active fuses 202, 204, . . . connected to the m intermediate wires $W_1$, $W_2$, . . . Further, a second wire $W_0$ is connected to the m second semiconductor active fuses 202, 204, . . . Firstly, the first semiconductor active fuses 201, 203, and the second semiconductor active fuses 202, 204 will be described referring to FIGS. 2A and 2B.

Figure 2A:
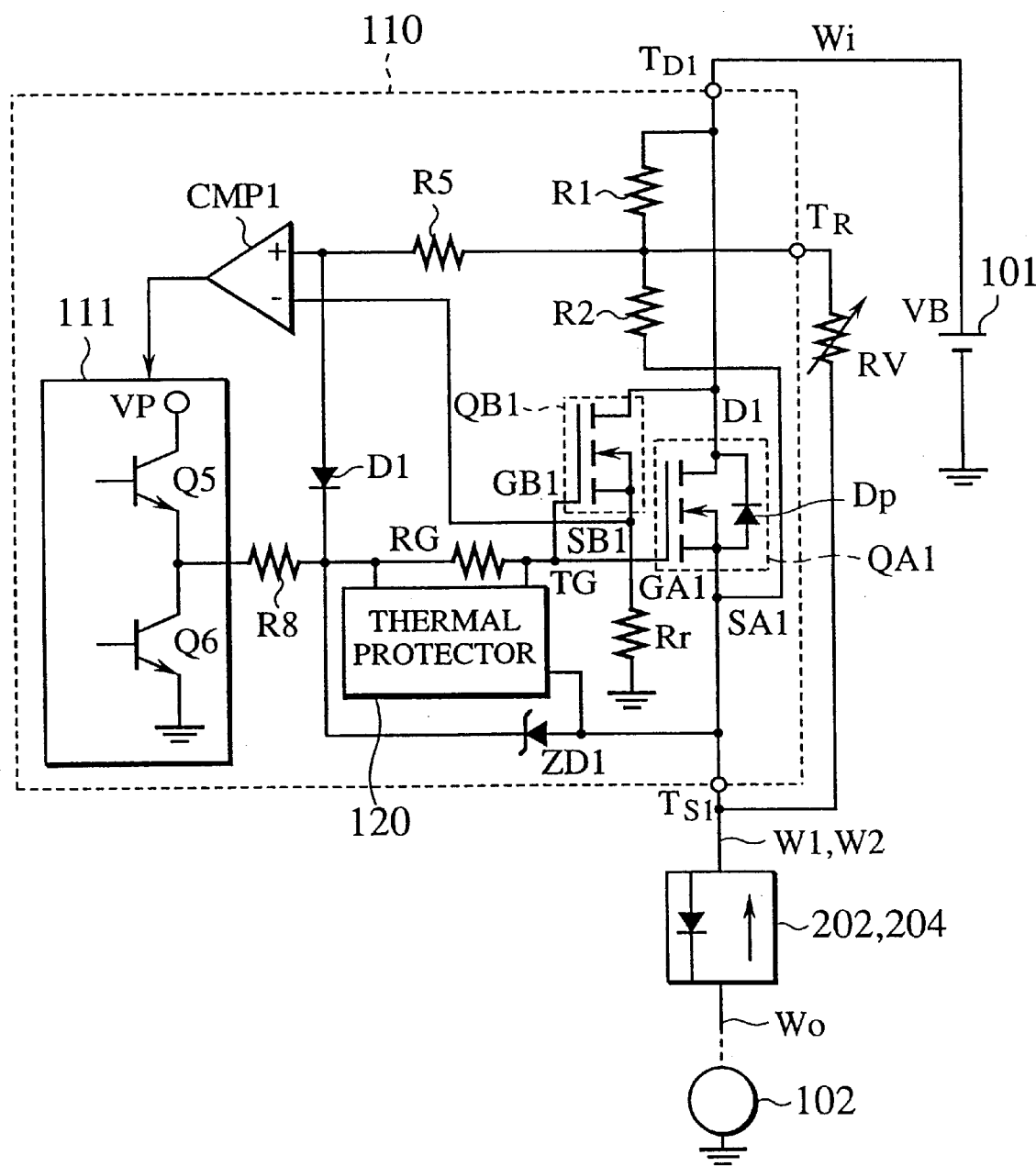
FIG. 2A is a block diagram showing a first semiconductor active fuse used for the power supply system of the present invention.

As shown in FIG. 2A, the first fuses 201, 203 respectively include at least a first main semiconductor element QA1, a first reference semiconductor element QB1, a first comparator CMP1, and a first driver 111. In FIG. 2A, the first main semiconductor element QA1 and the first reference semiconductor element QB1 are nMOS transistors. The first main semiconductor element QA1 includes a first main electrode D1 (i.e. a drain electrode) connected to the first wire $W_1$, a second main electrode (i.e. a source electrode) SA1 in opposed relation to the first main electrode D1, and a first control electrode GA1 for controlling the main current. The first main electrode D1 is connected to the power source 101 via the first wire $W_1$. The first main semiconductor element QA1 includes a first parasitic diode $D_P$ therein. The cathode region of the first parasitic diode $D_P$ is connected to the first main electrode D1 of the first main semiconductor element QA1, and the anode region thereof is connected to the second main electrode SA1 of the first main semiconductor element QA1. The first reference semiconductor element QB1 includes a third main electrode (i.e. a drain electrode) D1 and a second control electrode GB1 respectively connected to the first main electrode D1 and the first control electrode GA1, and a fourth main electrode (i.e. a source electrode) SB1. The first comparator CMP1 compares the voltage of the first main electrode SA1 and that of the fourth main electrode SB1. The first comparator CMP1 and the first driver 111 together constitute a control circuit for detecting whether or not an abnormal current flows through the first main semiconductor element QA1, and when an abnormal current is detected, they start an on-off operation of the semiconductor device QA1 to generate a current oscillation. That is, the first semiconductor active fuses 201, 203 respectively have a structure of power integrated circuit (i.e. power IC) on which the first main semiconductor element (i.e. a power device) QA1 and the control circuit for controlling the main semiconductor element QA1 are integrated on a same substrate. Alternatively, the first semiconductor active fuses 201, 203 may have a structure of hybrid IC on which the first main semiconductor element QA1 and the control circuit are mounted on an insulating substrate made of materials such as ceramics and glass epoxy, or an insulating metal substrate. However, preferable is a structure of power IC on which the first semiconductor active fuses 201, 203 and the control circuit are merged on a single semiconductor chip 110.

As shown in FIG. 2A, the first semiconductor active fuses 201, 203 respectively further include resistors R1, R2, R5, R8, RG, a reference resistor Rr, a Zener diode ZD1, and a diode D1. The driver 111 includes a source transistor Q5 of which collector electrode side is connected to a high level potential VP and a sink transistor Q6 of which emitter electrode side is connected to a ground GND. The source transistor Q5 and the sink transistor Q6 are connected to each other in series. Based on a predetermined switching signal, the source transistor Q5 and the sink transistor Q6 are turned on and off to output signals for driving/controlling the first main semiconductor element QA1 and the second reference semiconductor element QB1 to their respective control electrodes. The driver 111 shown in FIG. 2A is a bipolar junction transistor (BJT); alternatively, it may be a MOS transistor. For example, the driver 111 may be a complementary metal-oxide-semiconductor (CMOS) configuration. When the driver 111 is a MOS transistor, the power IC (i.e. the semiconductor active fuse) of the present invention can be fabricated by the simple standard process for manufacturing the MOS transistor. When the driver 111 is a BJT, the power IC of the present invention can be manufactured by the BiMOS process. The output voltage VB of the power source 101 is 12 V for example, and the output voltage VP of the charge pump is VB+10 V for example.

To the second main electrode (i.e. the source electrode) of the first reference semiconductor element QB1, the reference resistor Rr is connected. It is not always necessary that the reference resistor Rr is monolithically integrated in the semiconductor active fuse, but may be an external resistor. In this case, the reference resistor Rf could be connected to the second main electrode of the first reference semiconductor element QB1 via an external terminal. The value of resistance of the reference resistor Rf is selected in accordance with the ratio between the channel width W of the first reference semiconductor element QB1 and that of the first main semiconductor element QA1. When the ratio between the width of the first reference semiconductor element QB1 to that of the first main semiconductor element QA1 is determined to N2:N1=1:1000, the value of resistance is set to thousand times of the resistance of the load 102, which conveys the current equal to the predetermined over current criterion. By setting the reference value of the reference resistor Rf to the value described above, the same drain-source voltage $V_{DS}$ as of the case where an overload current for an abnormal operation flows through the first main semiconductor element QA1 can be generated in the first reference semiconductor element QB1.

Between the first electrode (i.e. the drain electrode) D1 and the second main electrode (i.e. the source electrode) SA1 of the first main semiconductor element QA1, a series circuit of the resistors R1 and R2 is connected. Between the connection point of the resistor R1 and the resistor R2, and the second main electrode SA1 of the first main semiconductor element QA1, a variable resistor RV as an external resistor is connected via an external terminal. By changing the value of the variable resistor RV, the resistance value of the reference resistor R2 can be equivalently varied. In this manner, the semiconductor chip 110 can cover a plurality of specifications.

To the input terminal "+" of the comparator CMP1 shown in FIG. 2A, the voltage into which the voltage $V_{DSA1}$ between the first and second main electrodes of the first main semiconductor element QA1 (the voltage between the drain electrode D1 and source electrode SA1) is divided by the resistors R1, and the parallel resistance consisted of the resistor R2 and the variable resistor RV (R2∥RV), is supplied via the resistor R5. To the input terminal "−" of the comparator CMP1, the source voltage $V_{SB1}$ of the first reference semiconductor element QB1 is supplied. When the signal level $V_+$ at the input terminal "+" is higher than the signal level $V_-$ at the input terminal "−", the output of the comparator CMP1 becomes "H" level, and the driver 111 provide a predetermined voltage to the gate GA1 of the first main semiconductor element QA1. On the contrary, if the signal level $V_+$ at the input terminal "+" is lower than the signal level V at the input terminal "−", the output of the comparator CMP1 becomes "L" level, and the driver 111 turns off the gate drive against to the gate GA1 of the first main semiconductor element QA1. As will be described later, the comparator CMP1 exhibits some degree of hysteresis characteristic. Assisted by the hysteresis characteristic, the comparator CMP1 conducts an ON/OFF control for the first main semiconductor element QA1 to generate the current oscillation when an abnormal current is generated. By use of the current oscillation, the first main semiconductor element QA1 is cutoff.

Figure 2B:
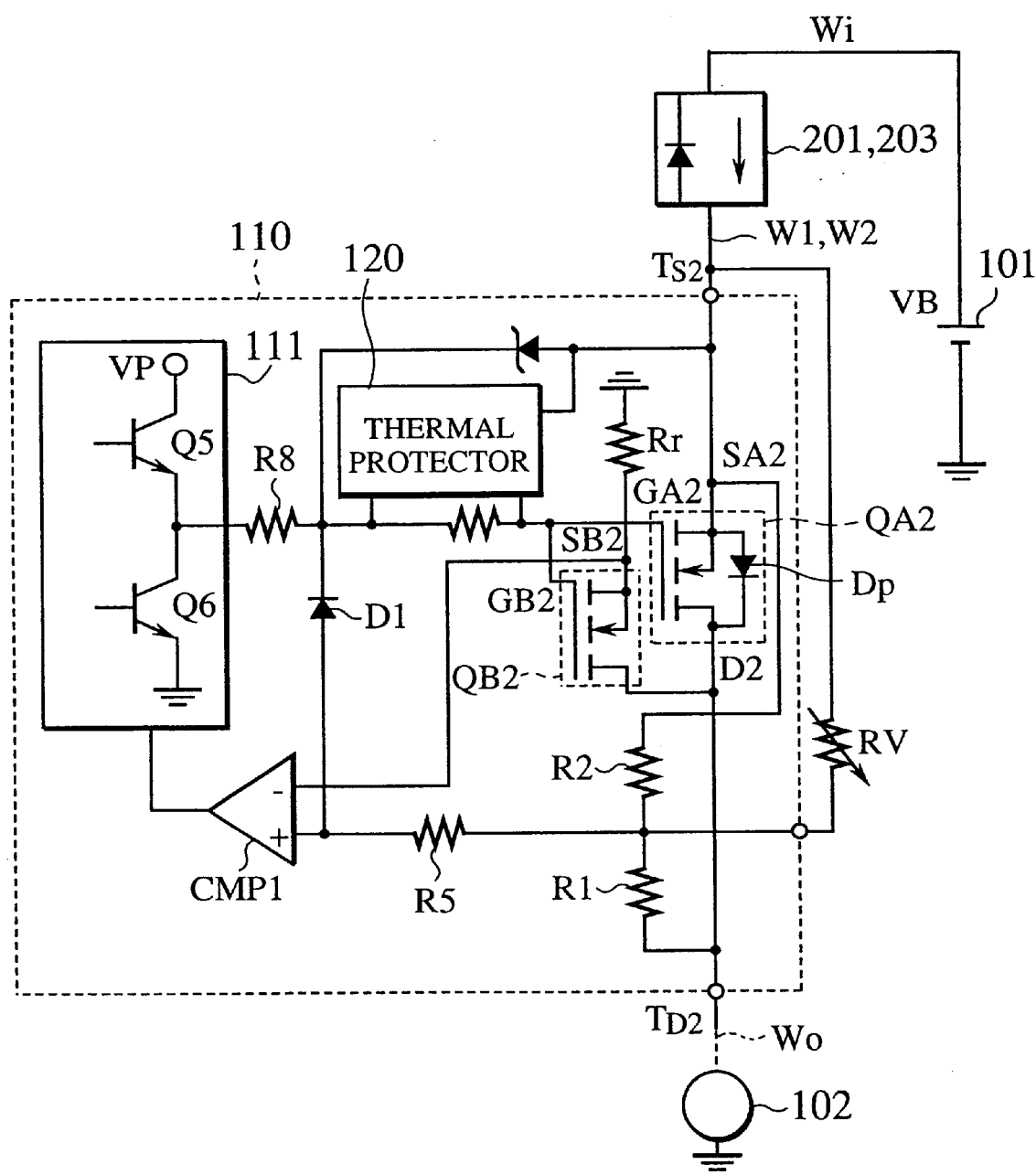
FIG. 2B is a block diagram showing a second semiconductor active fuse used for the power supply system of the present invention.

On the other hand, the second semiconductor active fuses 202, 204 basically have the same structure as of the first semiconductor active fuses 201, 203, except that they have opposite configuration in a wiring connection. As shown in FIG. 2B, the second semiconductor active fuses 202, 204 respectively include at least a second main semiconductor element QA2, a second reference semiconductor element QB2, a second comparator CMP1, and a second driver 111. In FIG. 2B, the second main semiconductor element QA2 and the second reference semiconductor element QB2 are nMOS transistors, as in the case of the first semiconductor active fuses 201, 203, except that the positions of the source and drain electrodes are reversed from those of the first semiconductor active fuses 201, 203. That is, to the second end of the intermediate wires $W_1$, $W_2$ respectively, a fifth main electrode (i.e. a source electrode) SA2 is connected. The second semiconductor active fuses 202, 204 includes a sixth main electrode (i.e. a drain electrode) D2 opposing to the fifth main electrode SA2, a third control electrode GA2 for controlling an main current flowing through the fifth and sixth main electrodes. The second main semiconductor element QA2 includes a second parasitic diode $D_P$ therein. The anode region of the second parasitic diode $D_P$ is connected to the fifth main electrode SA2 of the second main semiconductor element QA2, and the cathode region thereof is connected to the sixth main electrode D2 of the second main semiconductor element QA2. As a result, the polarity of the second parasitic diode $D_P$ is reversed to the polarity of the first parasitic diode $D_P$ of the first semiconductor active fuse. The second reference semiconductor element QB2 includes a seventh main electrode SB2 and a fourth control electrode GB2 respectively connected to the fifth main electrode SA2 and the third control electrode GA2, and an eighth main electrode (i.e. a drain electrode) D2. The second comparator CMP1 compares the voltage of the fifth main electrode with the voltage of the seventh main electrode. The second comparator CMP1 and the second driver 111 together constitute a control circuit for detecting whether or not an abnormal current flows through the second main semiconductor element QA2, and when an abnormal current is detected, they conducts an ON/OFF control for the second main semiconductor element QA2 to generate the current oscillation. By use of the current oscillation, the second main semiconductor element QA2 is finally cutoff. The second semiconductor active fuses 202, 204 respectively have the structure of power IC on which the second main semiconductor element (i.e. the power device) QA2 and the control circuit for controlling the main semiconductor element QA2 are integrated on the same substrate.

Figure 3A:
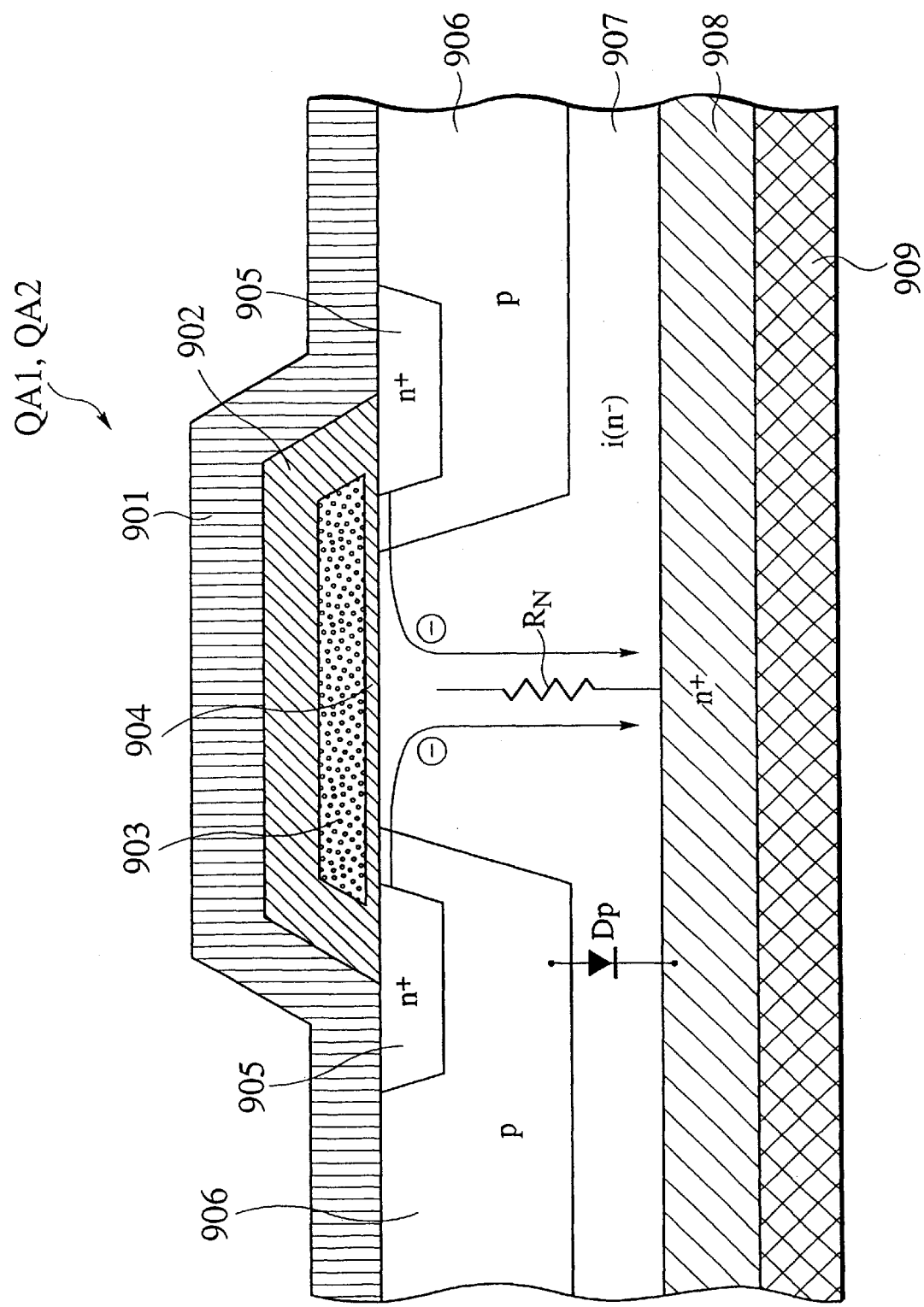
FIG. 3A is a schematic sectional view showing a part of a unit cell of DMOS transistor used for the semiconductor active fuse of the present invention.

FIG. 3A is a cross-sectional view showing a part of the units of the nMOS transistor having the DMOS structure, as a specific example of the first main semiconductor element QA1. The second main semiconductor element QA2 has the same structure. In reality, pluralities of the units are arranged in parallel with each other (for example, the number of units N1=1000) to obtain a desired rated current handling capability. The nMOS transistor QA1, QA2 shown in FIG. 3A includes an $n^+$ region 908 serving as the drain region, an $n^-$ region 907 serving as the drift region which is epitaxially grown on the $n^+$ region 908, and two island-shaped p-body region 906 facing each other on the surface of the drift region 907. In FIG. 3A, although two p-body regions 906 are shown in a cross-sectional view in appearance, they may be joined to each other in an area invisible in FIG. 3A toward its depth direction. In other words, when the corresponding plan view is seen from the above, the p-body region 906 may have a single continuous region of circle or rectangular ring (i.e. a donut). On the surface of the p-body region 906, an $n^+$ region 905 serving as the source region is formed. As in the case of the p-body region 906, the $n^+$ region 905 serving as the source region also may be joined to each other in an area invisible in FIG. 3A toward its depth direction, and may have a single shape of circle or rectangular ring (i.e. a donut). On the p-body region 906 and the drift region 907 surrounded by the p-body region 906, a gate insulating film 904 is formed, and on the gate insulating film 904, a gate electrode 903 is formed. On the gate electrode 903, an interlayer dielectric film 902 is formed. In the interlayer dielectric film 902, a contact hole is formed, and a source electrode 901 is formed in such a manner that the p body region 906 and the source region 905 are short-circuited through the contact hole. On the bottom surface of the drain region 908, a drain electrode 909 is formed. In the DMOS structure shown in FIG. 3A, a parasitic diode $D_P$ having the p-n junction structure is present between the p body region 906 and the $n^+$ drain structure 908. Therefore, by employing the bias using the drain electrode 909 as a negative and the source electrode 901 as a positive, contrary to the bias employed for operating DMOS, the parasitic diode $D_P$ is forward biased so as to be conducted, that is, so-called reverse conduction occurs. In the present invention, the parasitic diode $D_P$ is positively used as a current path. As is obvious in FIG. 3A, the parasitic diode $D_P$ is formed in a large area over the entire bottom surface of the semiconductor chip. Therefore, it has a low on-state resistance, and the total conduction loss is small.

Figure 3B:
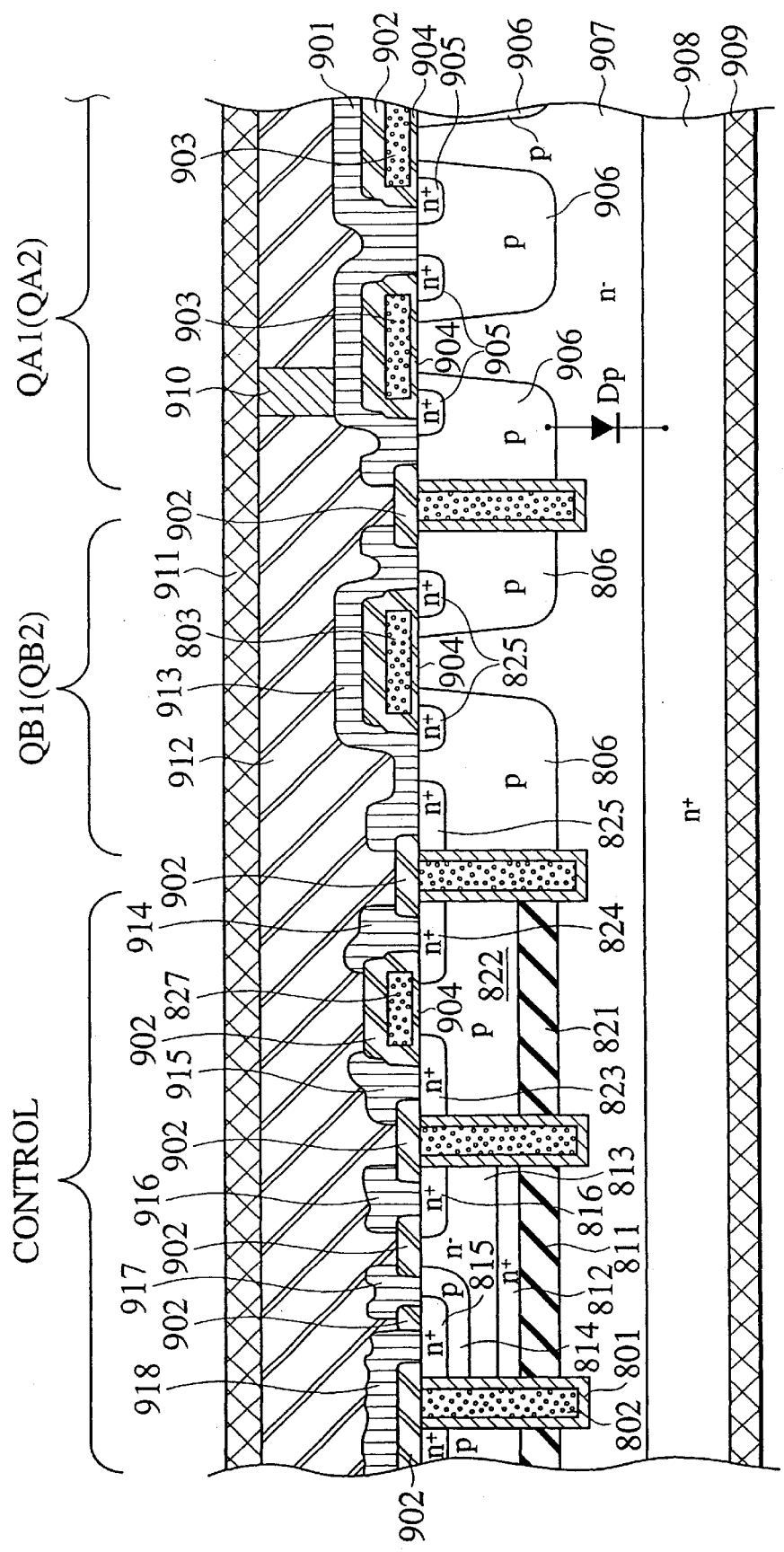
FIG. 3B is a schematic sectional view showing a part of structure of a power IC serving as the second semiconductor active fuse of the present invention.

The first semiconductor active fuse 201, 203, the second semiconductor active fuses 202, and 204 can have a same integrated structure as shown in FIG. 3B. Hereinafter the generic term of "the semiconductor active fuse" will be employed to represent one of the first semiconductor active fuse 201, 203, the second semiconductor active fuses 202, and 204. FIG. 3B is a cross-sectional view showing an example in which the semiconductor active fuse 201, 203, 202, or 204 is monolithically integrated on a single semiconductor chip. As shown in FIG. 3B, the semiconductor active fuse 201, 203, 202, or 204 includes a silicon-on insulator (SOI) oxide films (i.e. buried insulating films) 811, 821 only in the lower area of the control circuit for controlling the first (or second) main semiconductor element QA1 (or QA2), thereby partially forming an SOI structure. In the dielectrically isolated (DI) structure utilizing the partial SOI structure, the units of the control circuits for controlling the first (or second) main semiconductor element QA1 (or QA2) are electrically isolated from those for controlling the first (or second) reference semiconductor element QB1 (or QB2). Contrary to this, no SOI structure is formed for the first (or second) main semiconductor element QA1 (or QA2) that performs a main switching operation, but a structure of vertical power device, in which a current flows from the top surface to bottom surface of the semiconductor chip, is formed. Similarly, no SOI structure is formed for the first (or second) reference semiconductor element QB1 (or QB2) corresponding to it, but a structure of vertical power device is formed. As described above, the first (or second) main semiconductor element QA1 (or QA2) is formed with units in the number of N1 arranged in parallel with each other. The first (or second) reference semiconductor element QB1 (or QB2), formed with the same units as of the first (or second) main semiconductor element QA1 (or QA2) only in the number N2=1 also has a structure of vertical power device having no SOI oxide film. As has already described referring to FIG. 3A, the first (or second) main semiconductor element QA1 (or QA2) has the structure where the $n^+$ drain region 908 is formed on the entire bottom surface of the semiconductor chip, and the n-drift region 907 is formed thereon (The structure of the first (or second) main semiconductor element QA1 (or QA2) has already been described referring to FIG. 3A, and therefore, its description is omitted.)

In FIG. 3B, the first (or second) reference semiconductor element QB1 (or QB2) is formed with the $n^+$ drain region 908 and $n^-$ drift region 907 which are formed on the entire bottom surface of the semiconductor chip as common regions with the main semiconductor element QA1 and the control circuit for controlling it. That is, in the first (or second) reference semiconductor element QB1 (or QB2), an island-shaped p-body region 806 is formed on the surface of the $n^-$ drift region 907. On the surface of the p-body region 806, an $n^+$ region 825 serving as the source region is formed. On the p-body region 806 and the area of the drift region 907 surrounded by the p-body region 806, a gate insulating film 904 is formed. On the gate insulating film 904, a gate electrode 803 is formed. The gate electrode 803 is connected to the gate electrode 903. On the gate electrode 803, an interlayer dielectric film 902 is formed, and a contact hole is formed therein. A source electrode 913 is formed in such a manner that the p-body region 806 and the source region 825 are short-circuited through the contact hole. As shown in FIG. 2A, the source electrode 913 is connected to the reference resistor Rr of polysilicon mounted on the surface of the semiconductor chip. On the entire bottom surface of the drain region 908, a drain electrode 909, which is a common metallic, layer with the first (or second) main semiconductor element QA1 (or QA2) and the first (or second) reference semiconductor element QB1 (or QB2) is formed.

As shown in FIG. 3B, between the first (or second) main semiconductor element QA1 (or QA2) and the first (or second) reference semiconductor element QB1 (or QB2), a region for isolating their units from each other is formed. The element isolation region is formed so deep as to penetrate the p-body regions 806, 906. That is, the element isolation region is formed with a trench sidewall insulating film 801, formed on the sidewall of trench, and a semi-insulating poly-silicon (SIPOS) 802 interposed between the trench sidewall insulating films 801. Similarly, on the control circuit side, the element isolation region is formed with a trench, which extends so deep as to penetrate the SOI oxide films (i.e. buried insulating films) 811, 821.

On the control circuit side in FIG. 3B, the nMOS transistor formed on the p-well 822, and an n-p-n bipolar transistor formed on the $n^+$ buried collector region 812 are schematically shown. That is, on the SOI oxide film 821, the p-well 822 is formed, and in the p-well 822, the $n^+$ source region 823 add the $n^+$ region 824 are formed. On the region of the p-well 822 interposed between the $n^+$ source region 823 and the $n^+$ drain region 824, a gate insulating film 904 is formed. On the gate insulating film 904, a gate electrode 827 is formed. To the $n^+$ source region 823 and $n^+$ drain region 824 respectively, a source electrode 915 and a drain source electrode 914 are connected via the contact hole formed in the layer insulating film 902. On the SOI oxide film 811, an $n^+$ buried collector region 812 is formed. On the $n^+$ buried collector region 812, an $n^-$ drift region 813 is formed. On the surface of the $n^-$ drift region 813, a p-base region 814 is formed. In the p-base region 814, an $n^+$ emitter 815 is formed. On the surface of the $n^-$ drift region 813, $n^+$ collector contact region 816 is formed at the position apart from the p-base region 814. To the $n^+$ emitter region 815, the p-base region 814, and the $n^+$ collector contact region 816 respectively, an emitter electrode 918, a base electrode 917, and a collector electrode 916 are connected via the contact hole formed in the interlayer dielectric film 902.

On the emitter electrode 918, base electrode 917, collector electrode 916, source electrode 915, drain electrode 914, source electrode 913, and source electrode 915, a passivation film 912 is deposited. In the passivation film 912, a via hole is formed. The via hole penetrates the passivation film 912 to reach the source electrode 901. In the via hole, a stub metal 910 is buried. Via the stub metal 910, a source electrode 901 for external connection, which is formed on the entire surface of the passivation film 912, is electrically connected to a source electrode 901. In the structure shown in FIG. 3B, the drain electrode 909 is formed on the entire bottom surface of the semiconductor chip, and the source electrode 911 for external connection is formed on the top surface of the semiconductor chip.

As shown in FIG. 3C, the drain electrode 909 is soldered to a plug terminal 311 with a solder 304, thereby forming a cable connector (plug). The source electrode 911 for external connection is soldered to an inner lead of a lead 314 with a solder 303. The semiconductor chip side of the plug terminal 311, the semiconductor chip 110, and the inner lead of the lead 314 are sealed with a resin sealant 315 by a known transfer molding method. The plug terminal 311 and lead 314 are made of, for example, aluminum (Al), copper (Cu), copper alloy such as Cu-Fe, Cu-Cr, Cu-Ni-Si, and Cu-Sn, nickel-iron alloy such as Ni-Fe, and Fe-Ni-Co, and a composite material of copper and stainless steel. It is also possible to use these metals plated with nickel (Ni) or gold (Au). As shown in FIG. 3C, a central conductor 301 and an outer lead of the lead 314 are electrically connected with a solder 305. The central conductor 301 is covered with an insulator 302. The plug terminal 311 is connected to a metal casing for containing the resin sealant 315 via the insulator 312.

The plug terminal 311 is inserted into a jack terminal 323 shown in FIG. 3D. The jack terminal 323 is electrically connected to the central conductor 301 constituting the power supply cable with a solder 306. The metal casing 321 of the jack is insulated from the jack terminal 323 by an insulator 322. By use of the cable connector shown in FIGS. 3C and 3D, in the power IC shown in FIG. 2A, the drain electrode 909 as the input terminal $T_{D1}$ is connected to the power supply 101 for supplying the output voltage VB via the power supply cable W. Similarly, the source electrode 911 for external connection as the output terminal $T_{S1}$ is connected to the intermediate wiring W1 or W2. Further, as shown in FIG. 2A, the drain electrode 909 as the input terminal $T_{D2}$ is connected to the Load 102 via the power supply cable $W_u$. Similarly, the source electrode 911 for external connection as the output terminal $T_{S1}$ is connected to the intermediate wiring W1 or W2.

Figure 4:
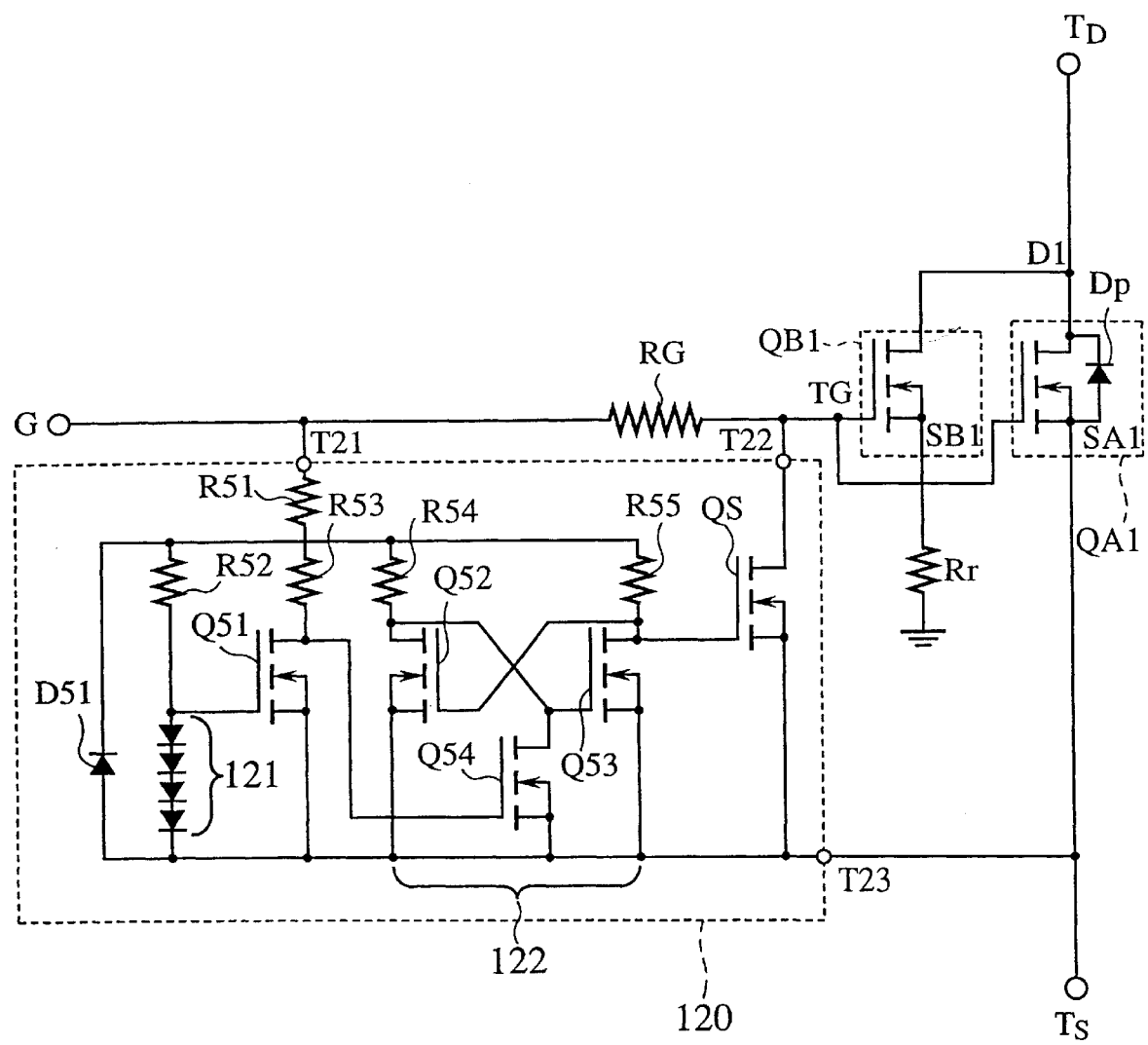
FIG. 4 is a circuit diagram showing a thermal protector, which is mounted on the power IC and detects an increase in the temperature of a semiconductor chip so as to cutoff the main semiconductor element.

As shown in FIG. 2A or 2B, the gate electrode of the first (or second) main semiconductor element QA1 (or QA2) is connected to a thermal protector 120. The thermal protector 120 detects an increase in the temperature of the semiconductor chip 110, and when the temperature of the semiconductor exceeds a predetermined value, turns off the first (or second) main semiconductor element QA1 (or QA2). The thermal protector 120 for the first main semiconductor element QA1 has a circuit configuration shown in FIG. 4, for example. The thermal protector 120 for the second main semiconductor element QA2 has an exactly same circuit configuration as shown in FIG. 4, and the overlapped explanation is omitted here.

The thermal protector 120 includes an MOS transistor QS, or "the thermal cutoff transistor QS", connected to the gate electrode of the first main semiconductor element QA1, a latch circuit 122 for inputting a signal to the gate electrode of the thermal cutoff transistor QS, and a temperature sensor 121 for controlling the latch circuit 122. When the temperature sensor 121 detects that the temperature at the surface of the semiconductor chip 110 has increased up to a predetermined temperature or higher, the state of the latch circuit 122 changes in accordance with the information from the temperature sensor 121, and the latch circuit keeps this state. As a result, the thermal cutoff transistor QS is turned on, and the gate electrode of the first main semiconductor element QA1 is short-circuited to the source electrode of the first main semiconductor element QA1, thereby compulsorily turning off the first main semiconductor element QA1.

The temperature sensor 121 is formed with four diodes of poly-silicon or the like, connected to each other in series, and is integrated in the vicinity of the first main semiconductor element QA1. As the junction temperature of the first main semiconductor element QA1 increases, the temperature at the surface of the semiconductor chip increases. Accordingly, the forward voltage drops of four diodes of the temperature sensor 121 gradually decrease. When the sum of the forward voltage drops of four diodes decreases to the potential level at which the potential of the gate potential of the nMOS transistor Q51 becomes "L" level, the nMOS transistor Q51 is turned off. As a result, the gate potential of the nMOS transistor Q54 is pulled up to the potential of the gate control terminal G of the first main semiconductor element QA1, thereby turning on the nMOS transistor Q54. The nMOS transistor Q53 is turned off, and the nMOS transistor Q52 is turned on and latches "1" into the latch circuit 122. At this time, the output of the latch circuit 122 becomes "H" level, thereby turning on the thermal cutoff transistor QS. As a result, the true gate TG of the first main semiconductor element QA1 is short-circuited to the source of the first main semiconductor element QA1, and the first main semiconductor element QA1 is turned off, thereby preventing it from being overheated. The thermal protector 120 may be omitted if the number of current oscillation is counted.

The first main semiconductor element QA1 is, for example, a power device having a multi-channel structure where a plurality of unit cells are connected in parallel with each other. At the location adjacent to the first main semiconductor element QA1, an MOS transistor QB1 as the first reference semiconductor element is disposed to be connected to the first main semiconductor element QA1 in parallel with each other. Since the first reference semiconductor element (reference MOS transistor) is formed at the position adjacent to the first main semiconductor element (main MOS transistor) QA1 in the same process, there is no (or only a small) variation in the electric characteristics therebetween caused by a temperature drift and the characteristic variation from lot to lot. The number of unit cells constituting the respective MOS transistors is adjusted so that the first reference semiconductor element QB1 has a current handling capability smaller than that of the first main semiconductor element QA1. For example, when the number of unit cell of the first reference semiconductor element QB1 is N2=1, the first main semiconductor element QA1 is constituted to have unit cells in the number of N1=1000. In this manner, the ratio between the channel width W of the first reference semiconductor element QB1 to that of the first main semiconductor element QA1 becomes N2:N1=1:1000. The temperature sensor 121 is constituted by a plurality of diodes disposed on the interlayer dielectric film formed on the first reference semiconductor element QB1 and the first main semiconductor element QA1. The temperature sensor 121 is made of poly-silicon thin film and the like and connected to each other in series, and is integrated at the position in the vicinity of the channel region of the first main semiconductor element QA1.

Figure 6:
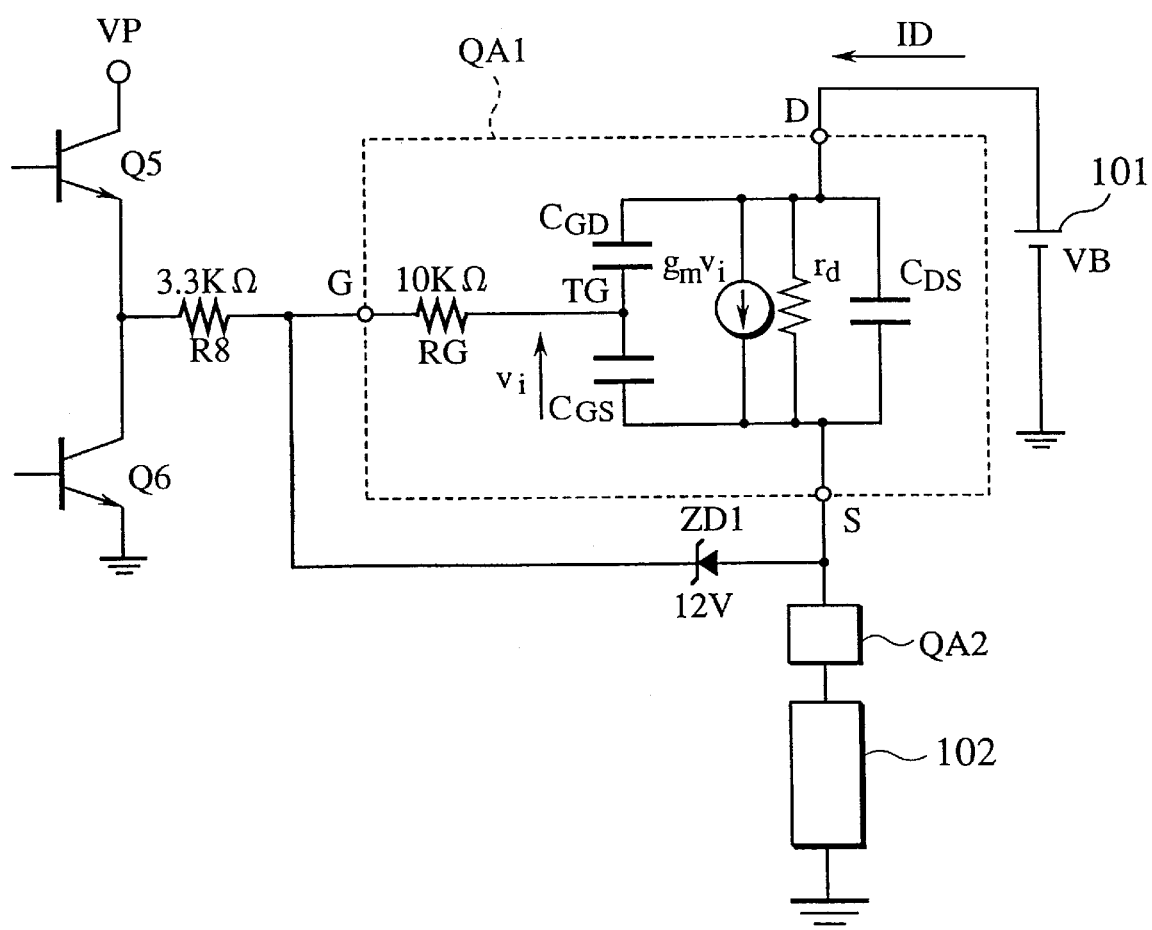
FIG. 6 is a conceptual equivalent circuit diagram showing the main semiconductor element of the semiconductor active fuse used for the power supply system of the present invention.

FIG. 6 is a conceptual equivalent circuit diagram showing the first main semiconductor element QA1 of the power IC used for the power supply system of the present invention. The same argument is hold for the second main semiconductor element QA2 of the power IC used for the power supply system of the present invention, and the overlapped discussion is omitted here. In FIG. 6, the equivalent circuit of the first main semiconductor element QA1 is simplified using an equivalent source of current $g_m$-$v_1$, a drain resistor rd, a capacitance $C_{GS}$ between the gate and source, a capacitance $C_{GD}$ between the gate and drain, and a capacitance $C_D$, between the drain and source electrodes. Where $g_m$ means a transfer conductance of the first main semiconductor element QA1. When the equivalent circuit of the first main semiconductor element QA1 is used, the power supply path from the power source 101 to the load 102 is a circuit such as shown in FIG. 6. The load 102 includes a wire inductance L0 and the wire resistance R0 of the power supply path.

Figure 5:
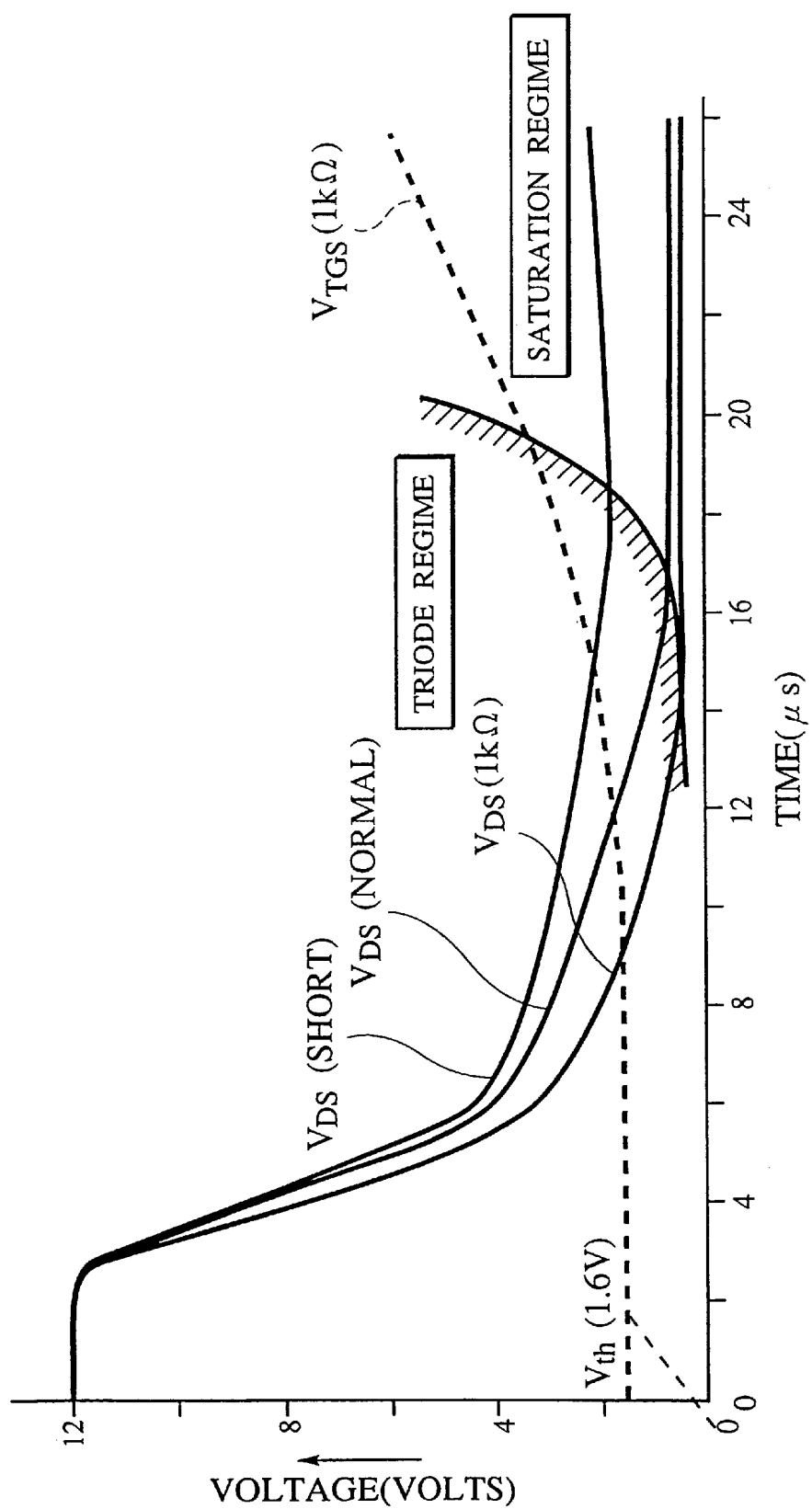
FIG. 5 is an explanatory drawing illustrating the principle of operation of the semiconductor active fuse used for the power supply system of the present invention, and also illustrating the transient voltage—between the drain and source electrodes when the system is turned on—varying from high to low level.

FIG. 5 is a diagram showing transient curves which illustrates three responses of the voltage $V_{DS}$ between the drain and source electrodes of the first main semiconductor element QA1, constituting a part of the above-described power supply system, at the transition from high to low level when the first main semiconductor element QA1 is turned from off to on. The curve "$V_{DS}$(SHORT)" represents the case where the load 102 is short-circuited, or the case where the wiring cable between the first main semiconductor element QA1 and the load 102 is short-circuited. And the curves "$V_{DS}$(NORMAL)" and "$V_{DS}$(1 kΩ)" represent the cases where the load 102 is a standard load (i.e. in a normal operation), and where the load 102 has a resistance of 1 kΩ, respectively. The characteristics of the transition from high to low level exhibit the transient responses in compliance with the impedance of the entire power supply cable of the present invention, for example, the wire inductance and the wire resistance of the power supply cable.

First, the change in the voltage $V_{DS}$ between the drain and source electrodes when the load 102 has a resistance of 1 KΩ will be described. It is assumed that, due to the characteristics of the first main semiconductor element QA1 used in this measurement, the voltage $V_{TGS}$ between the true gate TG and source is substantially at a threshold voltage Vth=1.6 V when the drain current ID=12 mA (when the supply voltage is 12 V and the load resistance is 1 KΩ). Since the driver 111 shown in FIG. 2A continues to charge the true gate TG of the first main semiconductor element QA1, the voltage $V_{TGS}$ between the true gate TG and source will continue to increase accordingly. In reality, however, the voltage $V_{DS}$ between the drain and source electrodes decreases, thereby increasing the capacitance value $C_{GD}$ between the true gate TG and drain to absorb the charge which would increase the voltage $V_{TCS}$ between the true gate TG and source, if the capacitance $C_{GD}$ could not increase. In other words, decreasing the voltage $V_{DS}$ between the drain and source electrodes increases the capacitance $C_{GD}$ existed between the true gate TG and drain to a level enough to absorb the charge which increases the potential of the voltage $V_{TGS}$ between the true gate TG and source to exceed the threshold value. As a result, the voltage $V_{TGS}$ between the true gate TG and source is kept at about 1.6 V (=Vth). That is, at each elapsed time after the first main semiconductor element QA1 is turned on, the voltage $V_{DS}$ between the drain and source electrodes takes a value at which the excessive charge from the driver 111 to the gate G is absorbed. In this manner, the voltage $V_{TGS}$ between the true gate TG and source is always kept at a constant level.

Let's define $\Delta V_{DS}$ as the difference between the voltage $V_{DS}$ across the drain and source when the load resistance R is 1 kΩ, expressed by the curve of FIG. 5, and the voltage $V_{DS}$ when the load resistance R is smaller than 1 KΩ. Further, the voltage $V_{TGSR}$ is defined as the voltage between the true gate TG and source, corresponding to the period t. Then, the charge $Q_{GD}$ is expressed by the following mathematical relationship:

$$Q_{GD} = \Delta V_{DS} \times C_{GD} + (V_{TGSR} - Vth) \times C_{CS} \tag{1}$$

By subtracting the voltage corresponding to the charges $Q_{GD}$ expressed by Eq. (1) from the voltage $V_{TGSR}$ between the true gate TG and source, the true voltage $V_{TGSR}$ becomes substantially a threshold voltage Vth=1.6 V. In other words, the voltage $V_{TGS}$ between the true gate TG and source is incremented from the threshold voltage Vth=1.6 by the voltage corresponding to the charge $Q_{CD}$. This can be expressed by the following equations:

$$(V_{TGSR}-Vth) \times C_{GS} + ((V_{TGSR}-Vth) - \Delta V_{DS}) \times C_{CD} = (\Delta V_{DS} - (V_{TGSR} - Vth)) \times C_{GD} \tag{2}$$

$$V_{TGSR} - Vth = \Delta V_{DS} \times 2C_{GD}/(C_{GS} + 2C_{GD}) \tag{3}$$

$$\therefore \Delta V_{DS} = (V_{TGSR} - Vth) \cdot ((C_{CS}/2C_{CD}) + 1) \tag{4}$$

From these equations, it is known that the value $\Delta V_{DS}$ is proportional to the value ($V_{TGSR}$-Vth). When the drain current ID is 0, the curve of the voltage $V_{DS}$ between the drain and source electrodes is determined by the Miller capacitance and the circuit charging the true gate TG. When the drain current $I_D$ increases, a counter electromotive force is generated by the inductance $L_c$ of the entire circuit, and the same effect as of the case where the load resistance is increased is generated. Therefore, as far as the drain current $I_D$ is increasing rapidly, the inductance-equivalent-resistance is generated, and the equivalent impedance of the load never decrease to a specific level determined by the inductance $L_c$ of the entire circuit, even if the net resistance value of the load becomes extremely small as in the case of dead short circuit. As a result, the rising gradient of the drain current $I_D$ converges into a specific value, and the curve of the voltage $V_{TGS}$ between the true gate TG and source converges to a specific value accordingly.

When a current mirror circuit is constituted by defining the ratio between the channel width W of the first reference semiconductor element QB1 and that of the first main semiconductor element QA1 of the semiconductor device (power IC) of the present invention as N2:N1 (n=N1/N2=1000), the relationship of (the drain current $I_{DQA}$ of the main semiconductor element)=1000×(the drain current $I_{DQB}$ of the reference semiconductor element) is established, whenever the source voltage of the first main semiconductor element QA1 is equal to that of the first reference semiconductor element QB1. When the drain current $I_{DQA}$ of 5A flows through the first main semiconductor element QA1, and the drain current $I_{DQB}$ of 5 mA flows through the first reference semiconductor element QB1, the source voltage $V_{SA}$ of the first main semiconductor element QA1 coincide the source voltage $V_{SB}$ of the first reference semiconductor element QB1. That is, the relationships of $V_{DSA}=V_{DSB}$ and $V_{TGSA}=V_{TGSB}$ are established. The terms of $V_{DSA}$ and $V_{DSB}$ are the voltages between the drain and source electrodes of the first main semiconductor element QA1 and the first reference semiconductor element QB1 respectively, and the terms $V_{TGSA}$ and $V_{TGSB}$ are the voltages between the true gate TG and source of the first main semiconductor element QA1 and the first reference semiconductor element QB1, respectively.

Therefore, when the first reference semiconductor element QB1 is completely turned on, it is estimated that the supply voltage VB is applied to the both terminals of the reference resistor Rr. In this case, the resistance value of the reference resistor Rr, as the load of the first reference semiconductor element QB1 which is equivalent to the load of 5A to be connected to the first main semiconductor element QA1, Rr=12/5 mA=2.4 KΩ.

Next, the operation of the semiconductor device (power IC), used for the power supply system of the present invention, in a saturation (also known as linear or pinch-off) regime of the MOS transistor will be described. When the first main semiconductor element QA1 is tuned on, the drain current $I_{DQA}$ raises toward the final load current value determined by the circuit resistance. The voltage $V_{TGSA}$ takes a value determined in accordance with the drain current $I_{DQA}$, and also gradually raises while it is suppressed by the Miller effect due to the capacitance $C_{GD}$ of the capacitor associated with the decrease of the voltage $V_{DSA}$ between the drain and source electrodes. In addition, the first reference semiconductor element QB1 operates as a source follower using the reference resistor Rr as a load resistance in accordance with the gate voltage determined by the first main semiconductor element QA1.

The voltage $V_{TGSA}$ between the true gate TG and source of the first main semiconductor element QA1 increases in accordance with an increase in the drain current $I_{DQA}$.

In the case, the following equations are established:

$$V_{DSA} = V_{TGSA} + V_{TGD} \tag{5}$$

$$V_{DSB} = V_{TGSB} + V_{TGD} \tag{6}$$

From these relationships, the following relationship is established:

$$V_{DSA} - V_{DSB} = V_{TGSA} - V_{TGSB} = (I_{DQA} - n \times 1_{DQB})/g_m \tag{7}$$

The terms $g_m$ means the transfer conductance of the first main semiconductor element QA1, and n=N1/N2 means the ratio between the channel width W of the first main semiconductor element QA1 and that of the first reference semiconductor element QB1. By detecting the difference in the voltages between the drain and source electrodes $V_{DSA} - V_{DSB}$, the difference in the drain current ($I_{DQA} - n \times I_{DQB}$) can be obtained.

The voltage $V_{DSB}$ between the drain and source electrodes of the first reference semiconductor element QB1 is input into the input terminal "−" of the comparator CMP1. The voltage $V_{DSA}$ between the drain and source electrodes of the first main semiconductor element QA1 is divided for the resistors R1 and R2, and the divided voltage V+ is input into the input terminal "+" of the comparator CMP1. That is, the voltage V+ represented by the following Eq. (8) is input into the input terminal "+" of the comparator CMP1:

$$V+ = V_{DSA} \times R1/(R1+R2) \tag{8}$$

When the load is in a normal state, the value Rr/n) becomes smaller than R(i.e. (Rr/n)<R), and the value V+ becomes smaller than $V_{DSB}$ (i.e. V+<$V_{DSB}$ accordingly. In this case, the first main semiconductor element QA1 is kept in an on state. The term R means the value of the load resistance. When the load is overloaded, the value (Rr/n) becomes larger than R(i.e. (Rr/n>R), and the value V+ becomes larger then $V_{DSB}$ (i.e. V+>$V_{DSB}$) accordingly. In this case, the main semiconductor element QA1 is turned off in the triode regime. Defining the source potential of the first main semiconductor element QA1 as $V_{SA}$ and that of the first reference semiconductor element QB1 as $V_{SB}$, the source potentials $V_{SA}$, $V_{SB}$ decrease toward the ground. As a result, the voltages $V_{DSA}$, $V_{DSB}$ between the drain and source electrodes increase. The relationship of V+<$V_{DSB}$ is established before the source potentials $V_{SA}$, $V_{SB}$ reach the ground, and the first main semiconductor element QA1 is turned on again. Immediately after being turned on, the first main semiconductor element QA1 is in the saturation (also known as linear or pinch-off) regime, and after that, it keeps its on-state toward the triode regime. When the value V+ becomes larger than $V_{DSB}$ (i.e. V+>$V_{DSB}$), the first main semiconductor element QA1 is turned off. This is one cycle of the on-off operation. Once the first main semiconductor element QA1 is turned off, it keeps its off state, and once it is turned on, it keeps its on state. This is due to the inductance of the load circuit. The inductance of the load circuit exhibits the same action as of the resistor when the current changes. When the current is decreased, the inductance-equivalent-resistance becomes minus to decrease the resistance on the load side. When the current is increased, the inductance-equivalent-resistance becomes plus to increase the resistance on the load side. Due to this action, once the first main semiconductor element QA1 is turned off, it keeps its off state, and once it is turned on, it keeps its on state. Contrary to this, in the first reference semiconductor element QB1, the reference resistor Rr has a value n=N1/N2 times larger than the load resistance R, and the circuit of the first reference semiconductor element QB1 has too small inductance effect to be discernible. Therefore, the circuit of the first reference semiconductor element QB1 acts as a pure resistance circuit.

In the comparator CMP1, the diode D1 and the resistor R5 together exhibits a hysteresis characteristic. When the first main semiconductor element QA1 is turned off, the sink transistor of the driver 111 grounds the gate potential. The potential on the cathode side of the diode D1 becomes $V_{SA}$−0.7 V (i.e. a forward voltage drop of Zener diode ZD1), and the diode D1 is conducted. As a result, a current flows through the resistor R1, the resistor R5, to the diode D1 in this order, and the signal level V+ of the input terminal "+" of the comparator CMP1 becomes larger than the value represented by Eq. (8) established when the driver 111 is in an on state. The first main seminconductor element QA1 keeps its off state until the difference in the voltages between the specific drain and source $V_{DSA} - V_{DSB}$, which is smaller than the voltage immediately before it is turned off, is attained. After that, as the value $V_{DSA}$ is further increased, the signal level V+ at the input terminal "+" of the comparator CMP1 becomes smaller than the value $V_{DSB}$. The output of the comparator CMP1 changes from "L" to "H" level, and the first main semiconductor element QA1 is turned on again. There are various methods for giving hysteresis characteristic, and the above described is one of them.

Defining the voltage $V_{DSA}$ between the drain and source electrodes when the first main semiconductor element QA1 is turned off as a threshold value $V_{DSAth}$, the following mathematical relationship is established:

$$V_{DSAth} - V_{DSB} = R2/R1 \times V_{DSB} \tag{9}$$

That is, the value used for judging the overcurrent in the triode regime is determined by Eq. (9).

Next, the operation of the semiconductor device (power IC), used for the power supply system of the present invention, in the triode regime (also known as ohmic regime) of the MOS transistor will be described. When the power supply system is in a normal state and the first main semiconductor element QA1 is turned on, the first main semiconductor element QA1 continues its on state. After the voltages $V_{TGSA}$, $V_{TGSB}$ between the true gate TG and source reaches pinch-off voltages, the first main semiconductor element QA1 and the first reference semiconductor element QB1 operate in the saturation regime. In the semiconductor device used for the power supply system of the present invention, a current mirror circuit is formed under the condition where ratio between the channel width W of the first reference semiconductor element QB1 and that of the first main semiconductor element QA1 is 1:n, whenever the source voltage of the first main semiconductor element QA1 coincides with that of the first reference semiconductor element QB1. Therefore, the on-state resistance $R_{DS(ON)B}$ of the first reference semiconductor element QB1 is n times larger than the on-state resistance $R_{DS(ON)A}$). fo the first main semiconductor element QA1 ($R_{DS(ON)B}$=n·$R_{DS(ON)}$). When the source voltage of the first main semiconductor element QA1 is equal to that of the first reference semiconductor element QB1, the drain current $I_{DQB}$ of the first reference semicondustor element QB1 is 1/n times larger than the drain current $1_{DQA}$ of the first main semiconductor element QA1($I_{DQB}$=(1/n)·$I_{DQA}$). Referring to the typical on-state resistance of 5A class semiconductor devices, for example, the on-state reference $R_{DS(ON)}$ of the first main semiconductor element QA1 can be estimated to be 30 mΩ when the voltage $V_{TGS}$ between the gate and source electrodes is 10 V. When n=N1/N2=1000, the on-state resistance $R_{DS(ON)R}$ of the fist reference semiconductor element QB1 is 30 Ω. If we suppose that supply voltage VB=12 V, and the reference resistor Rr=2.4 kΩ,, the following equations are established:

$$V_{DSB} = I_{DQB} \times (n \cdot R_{DSA(ON)}) = 5[mA] \times 30[\Omega] = 0.15[V] \quad (10)$$

$$V_{DSA} = I_{DQA} \times 30[m\Omega] \quad (11)$$

$$V_{DSA} - V_{DSB} = 30[m\Omega] \times (I_{DQA} - 5[A]) \quad (12)$$

As the drain current $I_{DQA}$ is increased due to the short-circuit failure of the power supply system and the like, the value obtained in Eq. (12) becomes large. When this value exceeds the criterion for judging the overcurrent, the first main semiconductor element QA1 is turned off. In this case, the first main semicondcutor element QA1 exhibits the operation in the above-described saturation regime via the pinch-off point, and then, is turned off. After the elapse of a predetermined time, the signal level V+ as the input terminal "+" of the comparator CMP1 becomes smaller than $V_{DSB}$ due to the hysteresis characteristic of the diode D1 and the resistor R5 shown in FIG. 2A. As a result, the output of the comparator CMP1 changes from "L" to "H" level, and the first main semiconductor element QA1 is turned on again. In this manner, the first main semiconductor element QA1 is repeatedly turned on and off, and at last, the thermal protector 120 starts to operate, thereby performing thermal protection action. If the power supply system returns to a normal state before the thermal protection action is started (i.e. in the case of intermittent short-circuit failure), the fist main semiconductor element QA1 keeps its on state.

FIG. 7A is a diagram showing the drain current $I_D$ of the semicondcutor device (power IC) used for the power supply system of the present invention. FIG. 7B is a diagram showing the voltage $V_{DS}$ between the drain and source electrodes corresponding to the drain current $I_D$. In FIGS. 7A and 7B, the curve ① corresponds to the overload state, and the curve ② corresponds to the normal state. In the case of the overload state (shown by the curve ①), the first main semiconductor element QA1 is repeatedly turned on and off to largely vary the drain current $I_D$. As a result, the first main semiconductor element QA1 periodically generates heat, thereby promoting the thermal protection action of the first main semiconductor element QA1. The same argument is hold for the second main semiconductor element QA2 of the power IC used for the power supply system of the present invention, and the overlapped discussion is omitted here. Next, the embodiments of the power supply system of the present invention will be described based on the description of the semiconductor active fuse referring to the accompanied drawings.

FIRST EMBODIMENT

FIG. 8A is a block diagram schematically showing the structure of the power supply system according to a first embodiment of the present invention. As shown in FIG. 8A, the power supply system according to the first embodiment includes at least two first semiconductor active fuses 201, 203 arranged in parallel with each other in a forward direction, a first wire $W_1$ connected to the input terminal $T_D$ of the first semiconductor active fuses 201, 203, and two intermediate wires $W_1$, and $W_2$ are respectively connected to output terminals $T_s$ of the first semiconductor active fuses 201, 203. The first wire $W_1$ has two branches, each of which is connected to the input terminals $T_D$ of the first semiconductor active fuses 201, 203. And, each of the intermediate wires $W_1$, $W_2$ has one end (a first end) and the other end (a second end). That is, the first ends are respectively connected to output terminals $T_s$ of the first semiconductor active fuses 201, 203. The power supply system of the first embodiment further has two second semiconductor active fuses 202, 204 arranged in parallel with each other in a reverse direction. Each of the two second semiconductor active fuses 202, 204 has an output terminal $T_S$ connected to one of the second ends of the respective two intermediate wires $W_1$, $W_2$. The power supply system of the first embodiment further has a second wire $W_0$, which is connected to an input terminal $T_D$ of the second semiconductor active fuses 202, 204. The second wire $W_0$ has two branches respectively connected to the input terminals $T_D$.

The "first seminconductor active fuses 201, 203" are power ICs having a circuit configuration such as shown in FIG. 2A, and the "second semiconductor active fuses 202, 204" are power ICs having a circuit configuration such as shown in FIG. 2B, which are substantially same as FIG. 2A, but inversely configured. As shown in FIG. 8A, a main power source 101 having a positive potential is connected to the first wire $W_1$, and loads L1, L2, and L3 are respectively connected to the second wire $W_0$ via semiconductor active fuses 207, 208, and 209. The term "main power source" means any main power supply source, and in the case of a vehicle, it corresponds to a battery mounted on the engine room.

As shown in FIG. 8A, the power supply system according to the first embodiment includes a plurality of intermediate wires $W_1$, $W_2$, ... (in the first embodiment, two intermediate wires $W_1$, $W_2$ are used, but m intermediate wires $W_1$, $W_2$, can be employed in general) as live wires. When a short-circuit failure occurs in one or some of the intermediate wires, the short-circuited wire is cutoff, thereby avoiding the influence of the short-circuit failure on another intermediate wires and loads. When a trouble such as breaking of wire occurs in one or some of the intermediate wires, the remaining wires cover up the trouble. This structure has an advantage in that it is easy to increase reliability and safety of the power supply system $W_1$, $W_2$ as live lines.

The power supply system according to the first embodiment needs no shunt resistor for overcurrent detection, which was connected to the conventional power cable in series. By eliminating the necessity of shunt resistor, the thermal dissipation and conduction loss of the entire power supply system can be suppressed to lower level. It is also possible to quickly and simply detect not only the overcurrent caused by dead short-circuit, but also the abnormal current caused by layer short-circuit such as imperfect short-circuit failure having some degree of short-circuit resistance. In addition, the power supply system according to the first embodiment needs no microcomputer for detecting and controlling overcurrent. By eliminating the necessity of the microcomputer, the space for mounting the detector and control circuit for the overcurrent can be saved. At the same time, the cost of the power supply system as a whole can be greatly reduced.

Figure 8B:
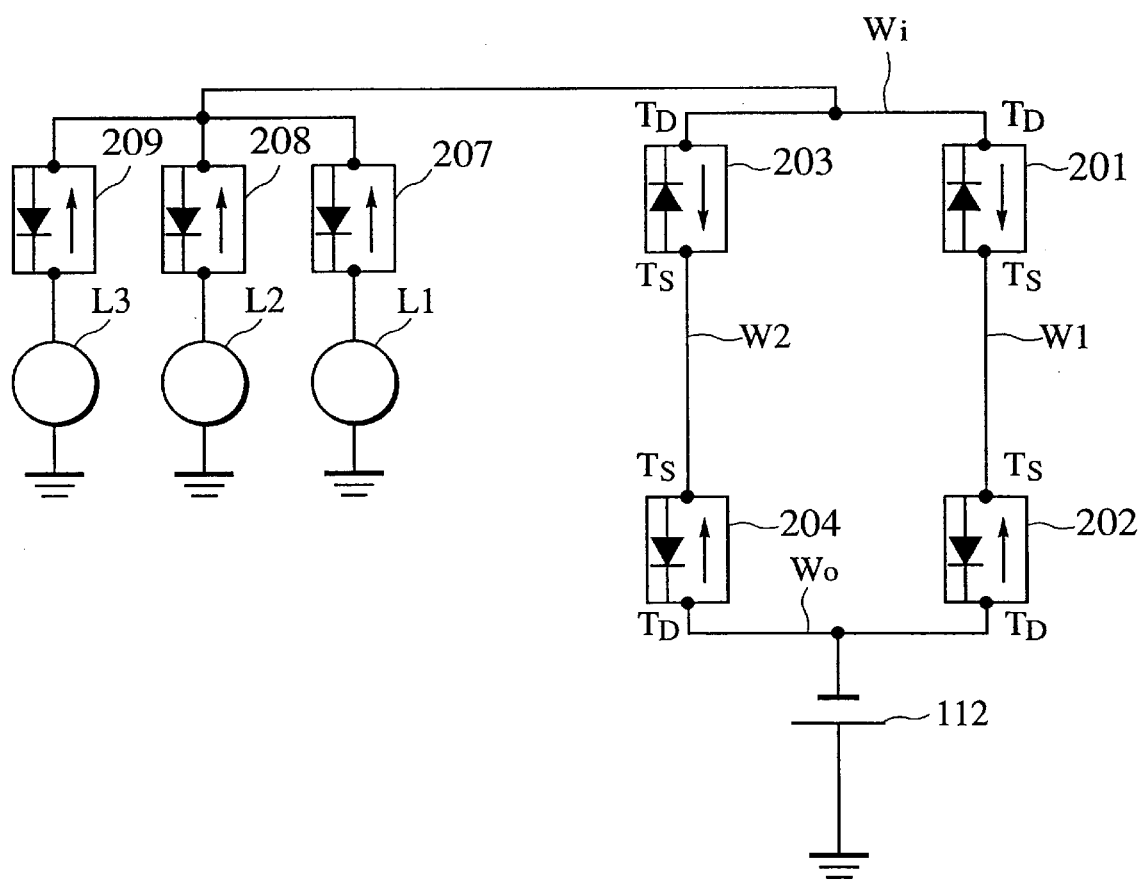
FIG. 8B is a block diagram schematically showing a power supply system according to a modification of the first embodiment of the present invention.

FIG. 8B is a block diagram schematically showing the structure of the power supply system according to a modification of the first embodiment. The power supply system of FIG. 8B has the same structure as that of FIG. 8A, except that load L1, L2, and L3 are connected to a first wire $W_1$ via active fuses 207, 208, and 209, respectively, and a main power source 112 having negative potential is connected to a second wire $W_0$. As in the case of the power supply system shown in FIG. 8A, the power supply system shown in FIG. 8B includes a plurality of intermediate wires (in this embodiment, two intermediate wires $W_1$, and $W_2$ are used) as live wires. When a short-circuit failure occurs in one or some of the intermediate wires, the short-circuited wire is immediately cutoff, thereby avoiding the influence of the short-circuit failure on another intermediate wires and loads, This structure has an advantage in that it is easy to increase reliability and safety of the power supply systems $W_1$, and $W_2$ as live lines. As in the case of the power supply system shown in FIG. 8A, the forward and reverse active fuses 201 to 204 are connected to the both ends of the respective intermediate wires $W_1$, $W_2$. The power supply system shown in FIG. 8B needs no shunt resistor for overcurrent detection, which was connected to the conventional power supply cable in series. By eliminating the necessity of shunt resistor, the thermal dissipation and conduction loss of the entire power supply system can be suppressed to lower level. It is also possible to quickly and simply detect not only the overcurrent casued by dead short-circuit, but also the abnormal current caused by imperfect short-circuit failure. In addition, the power supply system according to the modification of the first embodiment needs no microcomputer for detecting and controlling overcurrent. By eliminating the necessity of the microcomputer, the space for mounting the detector and control circuit for the overcurrent can be saved. At the same time, the cost of the power supply system as a whole can be greatly reduced.

SECOND EMBODIMENT

Figure 9A:
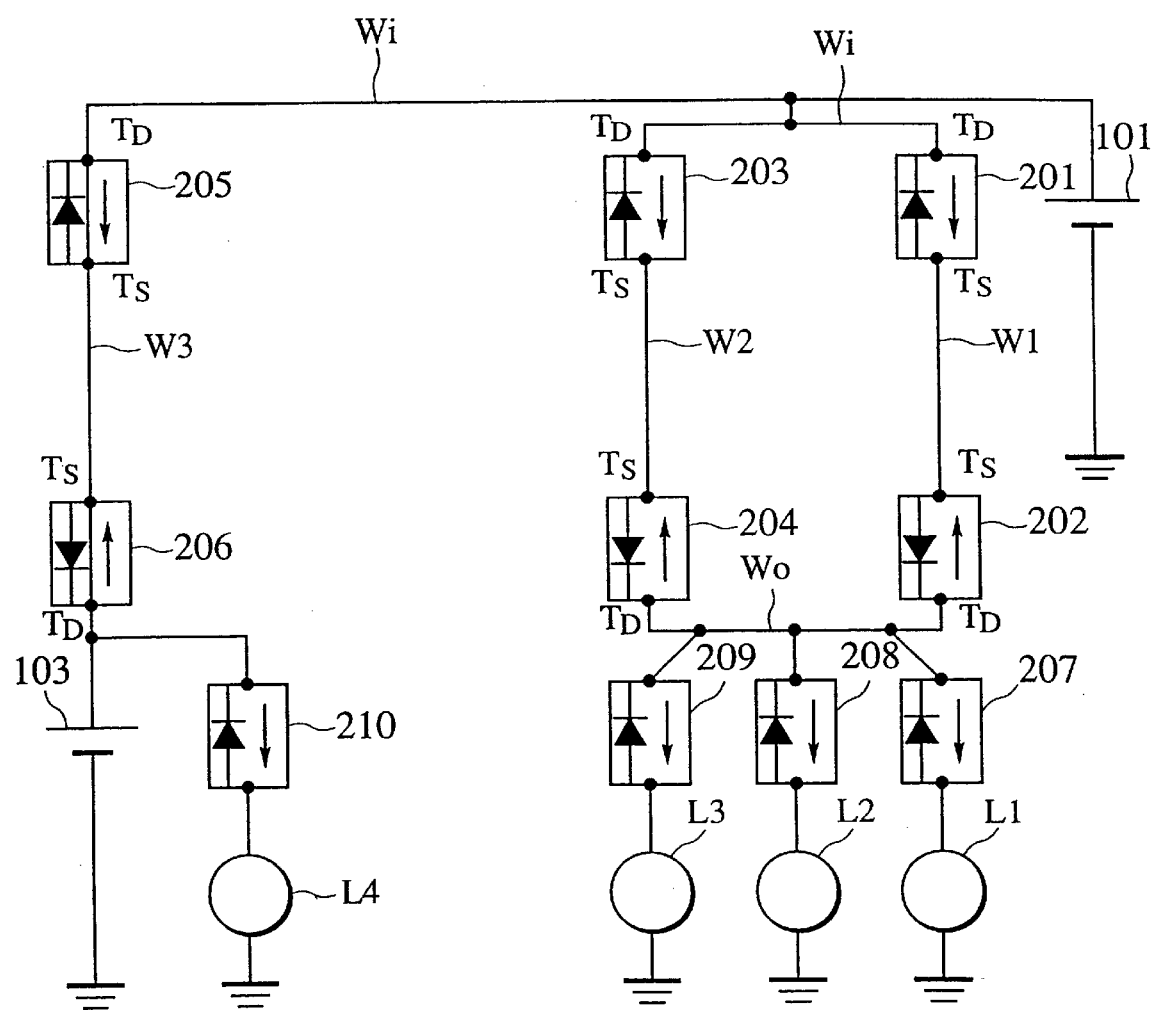
FIG. 9A is a flow diagram schematically showing a power supply system according to a second embodiment of the present invention.

FIG. 9A is a flow diagram schematically showing a power supply system according to a second embodiment of the present invention. As shown in FIG. 9A, the power supply system according to the second embodiment includes two first semiconductor active fuses 201, 203 connected in parallel with each other in a forward direction, a first wire $W_1$ connected to the respective input terminals $T_D$ of the first semiconductor active fuses 201, 203, two intermediate wires $W_1$, $W_2$ respectively connected to output terminals $T_s$ of the first semiconductor active fuses 201, 203, two second semiconductor active fuses 202, 204 arranged in parallel with each other in a reverse direction and having an output terminal $T_s$ connected to the second end of the respective intermediate wires $W_1$, $W_2$, a second wire $W_0$ connected to input terminals $T_D$ of the second semiconductor active fuses 202, 204, a first auxiliary semiconductor active fuse 205 of which input terminal $T_D$ is connected to the first wire $W_1$, an auxiliary wire $W_3$ connected to an output terminal $T_s$ of the first auxiliary semiconductor active fuse 205, and a second auxiliary semiconductor active fuse 206 having an output terminal $T_s$ connected to the second end of the auxiliary wire $W_3$.

The first auxiliary semiconductor active fuse 205 is a power 1C having a structure shown in FIG. 2A, and the second auxiliary semiconductor active fuse 206 is a power 1C having a structure shown in FIG. 2B. Specifically, the first auxiliary semicondcutor active fuse 205 includes a third main semiconductor element QA1, a third reference semiconductor element QB1, a third comparator CMP1, and a third driver 111. The third main semiconductor element QA1 includes a ninth main electrode (drain electrode) D1 connected to the first wire $W_1$, a tenth main electrode (source electrode) SA1 opposing to the ninth main electrode D1, and a fifth control electrode GA1 for controlling a main current flowing through the ninth and tenth main electrodes. The third main semiconductor element QA1 further includes a third parasitic diode $D_p$ of which cathode region is connected to the ninth main electrode D1 and of which anode region is connected to the tenth main electrode SA1. The third reference semiconductor element QB1 includes an eleventh main electrode (drain electrode) D1 and a sixth control electrode GB1 respectively connected to the ninth main electrode D1 and the fifth control electrode GA1, and a twelfth main electrode (source electrode) SB1. The third comparator CMP1 compares the voltages between the tenth main electrode SA1 and the twelfth main electrode SB1. The third driver 111 generates a signal to be applied to the fifth control electrode GA1 in accordance with the output of the third comparator CMP1.

The second auxiliary semiconductor active fuse 206 includes, as shown in FIG. 2B, a fourth main semiconductor element QA2, a fourth reference semiconductor element QB2, a fourth comparator CMP1, and a fourth driver 111. The fourth main semiconductor element QA2 includes a thirteenth main electrode (source electrode) SA2 connected to the second end of the auxiliary wire $W_3$, a fourteenth main electrode (drain electrode) D2 opposing to the thirteenth main electrode SA2, and a seventh control electrode GA2 for controlling the main current flowing through the thirteenth and fourteenth main electrodes. The fourth main semiconductor element QA2 further includes a fourth parasitic drode $D_p$ of which anode region is connected to the thirteenth main electrode SA2 and of which cathode region is connected to the fourteenth main electrode D2. The fourth reference semiconductor element QB2 includes a fifteenth main electrode (source electrode) SB2. Further the fourth reference semiconductor element QB2 has an eighth control electrode GB2 and a sixteenth main electrode (drain electrode) D2 respectively connected to the seventh control electrode GA2 and the fourteenth main electrode D2. The fourth comparator CMP1 compares the voltages between the thirteenth main electrode SA2 and fifteenth main electrode SB2. The fourth driver 111 generates a signal to be applied to the seventh control electrode GA2 in accordance with the output of the fourth comparator CMP1.

The "semiconductor active fuses 201 to 210" are power ICs having a structure shown in FIG. 2A or FIG. 2B. As shown in FIG. 9A, in the power supply system according to the second embodiment, a main power source 101 having a positive potential is connected to the first wire $W_1$, an auxiliary power source 103 having a positive potential is connected to the input terminal $T_D$ of the second auxiliary semiconductor active fuse 206, load L1, L2, and L3 are connected to the second wire $W_0$ via semiconductor active fuses 207, 208, and 209. The "main power source" corresponds to a battery and the like mounted in an engine room of a vehicle, and the "auxiliary power source" corresponds to an auxiliary battery and the like mounted in a trunk of a vehicle, for example.

The first to fourth main semiconductor element QA1, QA2 of the "semiconductor active fuse" of the present invention includes the parasitic diode $D_P$ having a p-n junction such as shown in FIG. 3A. The parasitic diode $D_p$ having a p-n junction is conducted under the bias condition where drain electrode 909 is negative and the source electrode 901 is positive, contrary to the bias condition for the DMOS to operate. As shown in FIG. 9A, in the power supply system according to the second embodiment, the parasitic diode Dp having a p-n junction is positively used as a current path for the second semiconductor active fuses 202, 204 and the first auxiliary semiconductor active fuse 206. As is obvious in FIG. 3A, the parasitic diode $D_p$ having the p-n junction is formed in a large area over the entire bottom surface of the DMOS, and therefore, it has a low on-state resistance. Even if two semiconductor active fuses are connected each other in opposing topology (reverse series connection), the total conduction loss is small.

As shown in FIG. 9A, the power source according to the second embodiment includes a plurality of intermediate wires $W_1$, $W_2$ (in the second embodiment, two intermediate wires $W_1$, $W_2$ are used) as live wires. When a short-circuit failure occurs in one or some of the intermediate wires, the short-circuited wire is cutoff, thereby avoiding the influence of the short-circuit failure on another intermediate wires and loads. When a trouble such as breaking of wire occurs in one or some of the intermediate wires, the remaining wires cover up the trouble. This structure has an advantage in that it is easy to increase reliability and safety of the power supply systems $W_1$, $W_2$ as live lines. Even if the power supply system of the main power source is cutoff, the loads can be driven by use of the power supply systems of the auxiliary power source. In addition, the forward and reverse semiconductor active fuses 201 to 204 are connected to the both ends of the respective intermediate wires $W_1$, $W_2$.

The power supply system according to the second embodiment needs no shunt resistor for overcurrent detection, which was connected to the conventional power cable in series, as in the case of the first embodiment. By eliminating the necessity of shunt resistor, the thermal dissipation and conduction loss of the entire power supply system can be suppressed to lower level. It is also possible to quickly and simply detect not only the overcurrent casued by dead short-circuit, but also the abnormal current caused by layer short-circuit such as imperfect short-circuit failure having some degree of short-circuit resistance. In addition, the power supply system according to the second embodiment needs no microcomputer for detecting and controlling overcurrent. By eliminating the necessity of the microcomputer, the space for mounting the detector and control circuit for thee overcurrent can be saved. At the same time, the cost of the power supply system as a whole can be greatly reduced.

Figure 9B:
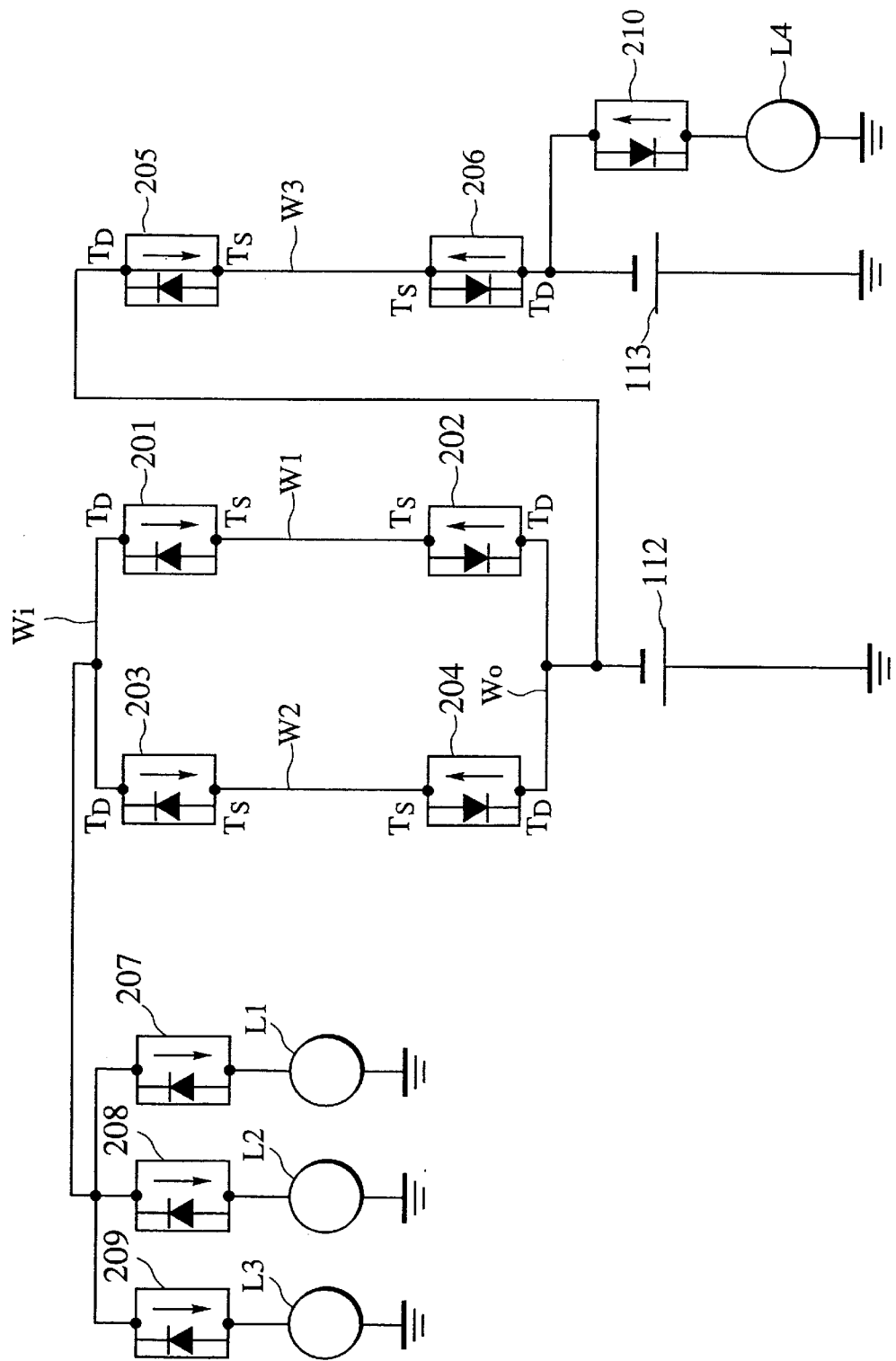
FIG. 9B is a block diagram schematically showing a modification of the power supply system according to the second embodiment of the present invention.

FIG. 9B is a block diagram schematically showing the structure of the power supply system according to a modification of the second embodiment. Contrary to the power supply system shown in FIG. 9A, in the power supply system of FIG. 9B, load L1, L2, and L3 are connected to the first wire $W_1$ via semiconductor active fuses 207, 208, and 209, respectively. A terminal $T_D$ of a first auxiliary semiconductor active fuse 205 is connected to the second wire $W_0$. An auxiliary wire W3 is connected to the output terminal $T_s$ of the first auxiliary semiconductor active fuse 205, and the output terminal $T_s$ of the second auxiliary semiconductor active fuse 206 is connected to the second end of the auxiliary wire $W_3$. A auxiliary power source 113 having negative potential is connected to the input terminal $T_D$ of the second auxiliary semiconductor active fuse 206. As in the case of the power supply system shown in FIG. 9A, the power supply system shown in FIG. 9B includes a plurality of intermediate wires (in this embodiment, two intermediate wires $W_1$, $W_2$ are used) as live wires. When a short-circuit failure occurs in one or some of the intermediate wires, the short-circuited wire is immediately cut-off, thereby avoiding the influence of the short-circuit failure on another intermediate wires and loads. In addition, the forward and reverse semiconductor active fuses 201 to 204 are connected to the both ends of the respective intermediate wires (live lines) $W_1$, $W_2$. Even if the power supply system of the main power source is cutoff, the loads can be driven by use of the power supply systems of the auxiliary power source. As in the case of the power supply system shown in FIG. 9A, the power supply system shown in FIG. 9B needs no shunt resistor for overcurrent detection which was connected to the conventional power cable in series. By eliminating the necessity of shunt resistor, the thermal dissipation and conduction loss of the entire power supply system can be suppressed to lower level. It is also possible to quickly and simply detect not only the overcurrent caused by dead short-circuit, but also the abnormal current casued by imperfect short-circuit failure. In addition, the power supply system according to the modification of the second embodiment needs no microcomputer for detecting and controlling overcurrent. By eliminating the necessity of the microcomputer, the space for mounting the detector and control circuit for the overcurrent can be saved. At the same time, the cost of the power supply system as a whole can be greatly reduced.

OTHER EMBODIMENTS

Various modifications will become possible for those skilled in the art after receiving the teachings of the present disclosure without departing from the scope thereof. For example, the first and second main semiconductor element integrated on the "semiconductor active fuse" of the present invention may be, besides the DMOS transistors shown in FIGS. 3A and 3B respectively, another power MOS transistor having a VMOS or UMOS structure, or MOSSIT having a substantially similar structure to them, but having shorter channel length so as to reduce the internal channel resistance. An IGBT, or a MOS composite device or other insulated gate power device can be employed. If the gate electrode is designed to be reverse biased, a junction FET, junction SIT, and SI thyristor also may be used. The first and second main semiconductor element may have either n-channel or p-channel. In the present invention, both of semiconductor devices having n-channel and p-channel respectively are used as the first semiconductor active fuses 201, 203. If the first semiconductor active fuse 201, 203 has p-channel respectively are used as the first semiconductor active fuses 201, 203. If the first semiconductor active fuse 201, 203 has p-channel, it has a polarity opposite to that shown in FIG. 2A. The terminal $T_D$ connected to the drain electrode D is an output terminal, and the terminal $T_S$ connected to the source electrode S is an input terminal.

As a current path of the second semiconductor active fuse, it is preferable to use the parasitic element (a parasitic p-n junction diode which is structurally present) in the semiconductor active fuse. Therefore, the first and second main semiconductor elements preferably are reverse conducting semiconductor power device. When they are not reverse conducting semiconductor power device, a diode can be additionally integrated thereon.

Figure 10:
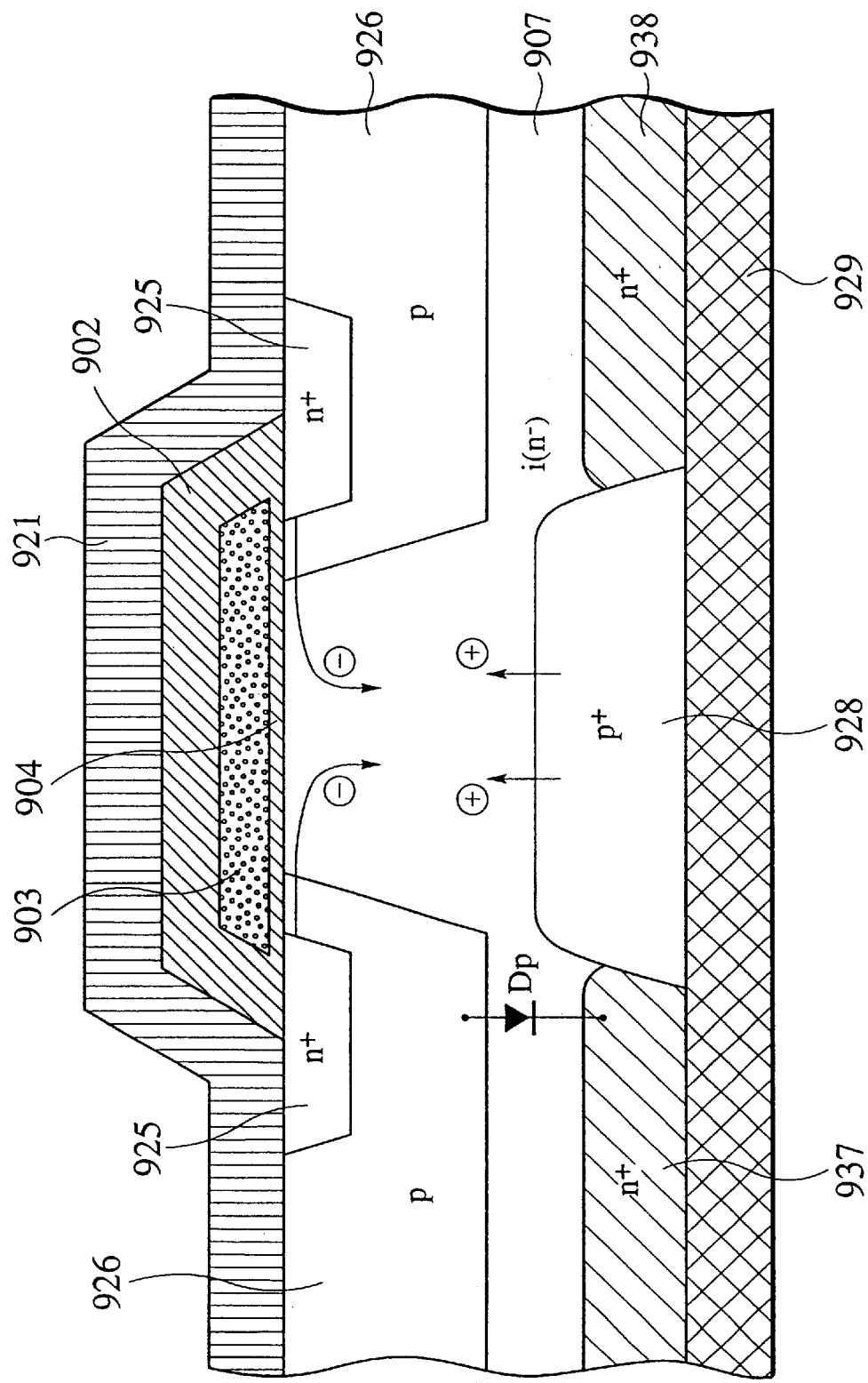
FIG. 10 is a sectional view showing a part of the unit cell of a collector-short type IGBT used for the semiconductor active fuse of the present invention.

FIG. 10 is a cross-sectional view showing a part of the unit of a collector-short-type IGBT, as another specific structure of the first main semiconductor element QA1 shown in FIG. 2A. In fact, a plurality of the units are arranged in parallel with each other on a semiconductor chip, thereby achieving a large current-capacitance. In the collector-short-type IGBT shown in FIG. 10, p+ regions 928 serving as the collector regions and n+ short regions 937, 938, . . . as n region 907 serving as the drift region is formed. On the surface of the drift region 907, two island-shaped p-base regions 926 are arranged facing each other. As in the case of FIG. 3A, in FIG. 10, although two p-base regions 926 are shown in a cross-sectional form in appearance, they may be joined to each other in an area invisible in FIG. 10 toward its depth direction. In other words, when seen from the above, the p-base region 926 may have one and single shape of circle or rectangular donut. On the respective p-base regions 926, an n+ region 925 serving as the emitter region is formed. The n+ region 925 serving as the emitter region also may be formed as a continue diffusion region having a single shape of circle or rectangular ring. On the p-base regions 926 and the portion of the drift region 907 interposed between the p-based regions 926, a gate insulating film 904 is formed, and on the gate insulating film 904, a gate electrode 903 is formed. On the gate electrode 903, an interlayer dielectric film 902 is formed. In the interlayer dielectric film 902, a contact hole is formed, and an emitter electrode 921 is formed in such a manner that the p-base region 926 and the emitter region 925 are short-circuited through the contact hole. When the IGBT is turned on, electrons are accumulated in the drift region 907 at the boundary to the collector region 928. The stored electrons promote the holes in the p+ collector region 928 to inject into the drift region 907. As a result, two kinds of carriers, that is, the electrons and holes are present in the drift region 907 to cause the conductivity modulation. Even if the drift region 907 is formed into thin thickness, low on-state resistance is available by the conductivity modulation. Due to this characteristic, the IGBT is used as a device having a higher blocking voltage and lower on-state resistance. As is generally known, at the time of turning off the IGBT, the tail current continues to flow until the electrons accumulated in the drift region 907 on the collector region disappear again by the recombination. This makes quick turn off of the IGBT impossible. By employing the collector-short structure shown in FIG. 10, the electrons stored in the drift region 907 at the boundary to the collector region can be extracted through the n+ short regions 937, 938, . . . The tail current at the time of turning off is suppressed, thereby enabling quick turn off of the IGBT.

The collector-short-type IGBT described above includes a parasitic diode $D_p$ having the p-n junction between the p-base region 926 and the n– drift region 907, as in the case of DMOS shown in FIG. 3A. By employing a bias condition where the collector electrode 929 is negative and the emitter electrode 921 is positive, which is reverse to the bias condition for operating the collector-short-type IGBT, the parasitic diode $D_p$ is conducted and so-called reverse conduction is created. By positively using such a parasitic diode $D_p$ as a current path for the semiconductor active fuse, high voltage can be quickly cutoff.

Obviously the present invention includes many modifications and variations, which are not described in the above description. Therefore, the scope of the present invention is to be determined solely by the appended claims.

What is claimed is:

1. A power system comprising:
   (a) a first wire having m branches (m≦2);
   (b) m first semiconductor active fuses respectively connected to the m branches of the first wire, respectively; each of the first semiconductor active fuses comprising:
      a first main semiconductor element including a first main electrode connected to one of the m branches of the first wire, a second main electrode opposing to the first main electrode, a first control electrode for controlling a main current flowing through the first and second main electrodes, and a first parasitic diode having cathode and anode regions, the cathode region is connected to the first main electrode and the anode region is connected to the second main electrode.
      first reference semiconductor element including a third main electrode and a second control electrode respectively connected to the first main electrode and the first control electrode, and a fourth main electrode;
      a first comparator comparing voltages of the second and fourth main electrodes; and
      a first driver for generating a signal to be applied to the first control electrode in accordance with the output of the first comparator;
   (c) m intermediate wires, each of the intermediate wires having first and second ends, the first end is connected to one of the second main electrodes;
   (d) m second semiconductor active fuses connected to the second ends of the m intermediate wires, each of the second semiconductor active fuses comprising:
      a second main semiconductor element including a fifth main electrode connected to one of the second end of the intermediate wire, a sixth main electrode opposing to the fifth main electrode, a third control electrode for controlling a main current flowing through the fifth and sixth main electrodes, and a second parasitic diode having cathode and anode regions, the anode region is connected to the fifth main electrode and the cathode region is connected to the sixth main electrode;
      a second reference semiconductor element including seventh, eighth main electrodes and the fourth control electrode connected to the sixth main electrode and the third control electrode, respectively;
      a second comparator comparing voltages of the fifth and seventh main electrodes; and
      a second driver for generating a signal to be applied to the third control electrode in accordance with an output of the second comparator; and
   (e) a second wire having m branches connected to the sixth main electrodes.

2. The power supply system of claim 1, wherein a main power source is connected to the first wire, configured to provide a positive potential to the first main electrodes, and a load is connected to the second wire.

3. The power supply system of claim 1, wherein a load is connected to the first wire, and a main power source having is connected to the second wire, configured to provide a negative potential to the sixth main electrodes.

4. The power supply system of claim 2, further comprising:

(f) a fist auxiliary semiconductor active fuse connected to the first wire comprising:
- a third main semiconductor element including a ninth main electrode connected to the first wire, a tenth main electrode opposing to the ninth main electrode, a fifth control electrode for controlling a main current flowing through the ninth and tenth main electrodes, and a third parasitic diode having cathode and anode regions, the cathode region is connected to the ninth main electrode and the anode region is connected to the tenth main electrode:
- a third reference semiconductor element including an eleventh main electrode and a sixth control electrode respectively connected to the ninth main electrode and the fifth control electrode, and a twelfth main electrode;
- a third comparator comparing voltages of the tenth and twelfth main electrodes; and
- a third driver for generating a signal to be applied to the fifth control electrode in accordance with an output of the third comparator;

(g) an auxiliary wire having first and second ends, the first end is connected to the tenth main electrode;

(h) a second auxiliary semiconductor active fuse connected to the second end of the auxiliary wire, comprising:
- a fourth main semiconductor element including a thirteenth main electrode connected to the second end of the auxiliary wire, a fourteenth main electrode opposing to the thirteenth main electrode, a seventh control electrode for controlling a main current flowing through the thirteenth and fourteenth main electrodes, and a fourth parasitic diode havnig cathode and anode regions, the anode region is connected to the thirteenth main electrode and the cathode region is connected to the fourteenth main electrode;
- a fourth reference semiconductor element including fifteenth, sixteenth main electrodes and an eighth control electrode, the sixteenth main electrode and the eighth control electrode connected to the fourteenth main electrode and the seventh control electrode, respectively;
- a fourth comparator comparing voltages of the thirteenth and fifteenth main electrodes; and
- a fourth driver for generating a signal to be applied to the seventh control electrode in accordance with an output of the fourth comparator; and (i) an auxiliary power source connected to the second auxiliary semiconductor active fuse, configured to provide a positive potential to the fourteenth main electrode.

5. The power supply system of claim 3, further comprising:

(f) a first auxiliary semiconductor active fuse connected to the second wire comprising:
- a ninth main electrode connected to the second wire, a tenth main electrode opposing to the ninth main electrode, a fifth control electrode for controlling a main current flowing through the ninth and tenth main electrodes, and a third parasitic diode having cathode and anode regions, the cathode region is connected to the ninth main electrode and the anode region is connected to the tenth main electrode;
- a third reference semiconductor element including an eleventh main electrode and a sixth control electrode respectively connected to the ninth main electrode and a fifth control electrode, and a twelfth main electrode;
- a third comparator comparing voltages of the tenth and twelfth main electrodes; and
- a third driver for generating a signal to be applied to the fifth control electrode in accordance with an output of the third comparator;

(g) an auxiliary wire having first and second ends, the first end is connected to the tenth main electrode;

(h) a second auxiliary semiconductor active fuse connected to the second end of the auxiliary wire, comprising:
- a thirteenth main electrode connected to the second end of the auxiliary wire, a fourteenth main electrode opposing to the thirteenth main electrode, a seventh control electrode for controlling a main current flowing through the thirteenth and fourteenth main electrodes, and a fourth parasitic diode having cathode and anode regions, the anode region is connected to the thirteenth main electrode and the cathode region is connected to the fourteenth main electrode;
- a fourth reference semiconductor element including fifteenth, sixteenth main electrodes and an eighth control electrode, the sixteenth main electrode and the eighth control electrode connected to the fourteenth main electrode and seventh control electrode;
- a fourth comparator comparing voltages of the thirteenth and the fifteenth electrode; and
- a fourth driver for generating a signal to be applied to the seventh control electrode in accordance with an output of the fourth comparator;

(i) an auxiliary power source connected to the second auxiliary semiconductor active fuse, configured to provide a negative potential to the fourteenth main electrode.

6. A power supply system comprising:

(a) a first wire having m branches (m≦2);

(b) m first semiconductor active fuses respectively connected to the m branches of the first wire, each of the first semiconductor active fuses has a first circuit for detecting a current, and cutting off an abnormal current detected by the first circuit;

(c) m intermediate wires, each of the intermediate wires having first and second ends, the first end is connected to one of the first semiconductor active fuses;

(d) m second semiconductor active fuses connected to the second ends of the m intermediate wires, respectively, each of the second semiconductor active fuses has a second circuit for detecting a current, and cutting off an abnormal current detected by the second circuit; and (e) a second wire having m branches connected to the second semiconductor active fuses.

7. The power supply system of claim 6, wherein said first circuit comprises a first main semiconductor element and a first control circuit for controlling the first main semiconductor element.

8. The power supply system of claim 6, wherein said second circuit comprises a second main semiconductor element and a second control circuit for controlling the second main semiconductor element.

9. The power supply system of claim 7, wherein said first main semiconductor element cuts off the abnormal current by counting number of peaks in a current oscillation, the current oscillation starts when the abnormal current is detected by the first control circuit.

10. The power supply system of claim 7, wherein said first main semiconductor element cuts off the conduction of the abnormal current by detecting an increase of the temperature of a semiconductor chip on which the first circuit is disposed, the increase of the temperature is caused by a current oscillation, the current oscillation starts when the abnormal current is detected by the first control circuit.

11. The power supply system of claim 8, wherein second main semiconductor element cuts off the abnormal current by counting number of peaks in a current oscillation, the current oscillation starts when the abnormal current is detected by the second control circuit.

12. The power supply system of claim 8, wherein said second main semiconductor element cuts off the conduction of the abnormal current by detecting an increase of the temperature of a semiconductor chip on which the second circuit is disposed, the increase of the temperature is caused by a current oscillation, the current oscillation starts when the abnormal current is detected by the second control circuit.

13. The power supply system of claim 7, wherein said first main semiconductor element is a reverse conducting semiconductor power device structurally having a parasitic p-n junction diode, which can be used as a path for a current flowing opposite in direction to a main current flowing through the first main semiconductor element.

14. The power supply system of claim 8, wherein said second main semiconductor element is a reverse conducting semiconductor power device structurally having a parasitic p-n junction diode, which can be used as a path for a current flowing opposite in direction to a main current flowing through the second main semiconductor element.

* * * * *